(12) United States Patent
Shinohara et al.

(10) Patent No.: US 11,072,728 B2
(45) Date of Patent: Jul. 27, 2021

(54) METHOD OF PRODUCING ANISOTROPIC CONDUCTIVE FILM AND ANISOTROPIC CONDUCTIVE FILM

(71) Applicant: DEXERIALS CORPORATION, Tokyo (JP)

(72) Inventors: Seiichiro Shinohara, Kanuma (JP); Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/369,539

(22) Filed: Mar. 29, 2019

(65) Prior Publication Data

US 2019/0224889 A1   Jul. 25, 2019

Related U.S. Application Data

(63) Continuation of application No. 14/422,470, filed as application No. PCT/JP2013/072617 on Aug. 23, 2013, now Pat. No. 10,272,598.

(30) Foreign Application Priority Data

Aug. 24, 2012   (JP) ................................. 2012-184886

(51) Int. Cl.
   *C09J 7/10*   (2018.01)
   *C09J 5/06*   (2006.01)
   (Continued)

(52) U.S. Cl.
   CPC ............ *C09J 7/10* (2018.01); *B29C 35/0805* (2013.01); *B29C 43/003* (2013.01);
   (Continued)

(58) Field of Classification Search
   None
   See application file for complete search history.

(56) References Cited

U.S. PATENT DOCUMENTS

| 6,034,331 A | 3/2000 | Tsukagoshi et al. |
| 2003/0178221 A1 | 9/2003 | Chiu et al. |

(Continued)

FOREIGN PATENT DOCUMENTS

| CN | 1217828 A | 5/1999 |
| CN | 1926675 A | 3/2007 |

(Continued)

OTHER PUBLICATIONS

Jul. 4, 2019 Office Action issued in Chinese Application No. 201810699544X.

(Continued)

*Primary Examiner* — Moazzam Hossain
*Assistant Examiner* — Stanetta D Isaac
(74) *Attorney, Agent, or Firm* — Oliff PLC

(57) ABSTRACT

Anisotropic conductive film produced that a light-transmitting transfer die having openings with conductive particles disposed therein is prepared, and photopolymerizable insulating resin squeezed into openings to transfer conductive particles onto the surface of the photopolymerizable insulating resin layer, first connection layer is formed which has a structure in which conductive particles are arranged in a single layer in a plane direction of photopolymerizable insulating resin layer and the thickness of photopolymerizable insulating resin layer in central regions between adjacent ones of the conductive particles is smaller than thickness of photopolymerizable insulating resin layer in regions in proximity to conductive particles; first connection layer is irradiated with ultraviolet rays through light-transmitting transfer die; release film is removed from first connection layer; second connection layer is formed on the surface of first connection layer opposite to light-transmitting transfer die; and third connection layer is formed on the surface of first connection layer.

13 Claims, 4 Drawing Sheets

(51) Int. Cl.
| | |
|---|---|
| C09J 9/02 | (2006.01) |
| B29C 35/08 | (2006.01) |
| B29C 43/00 | (2006.01) |
| B29C 43/20 | (2006.01) |
| B29D 7/01 | (2006.01) |
| H01L 23/00 | (2006.01) |
| H05K 3/32 | (2006.01) |
| H01R 4/04 | (2006.01) |
| B29K 63/00 | (2006.01) |
| B29K 505/00 | (2006.01) |

(52) U.S. Cl.
CPC .............. *B29C 43/203* (2013.01); *B29D 7/01* (2013.01); *C09J 5/06* (2013.01); *C09J 9/02* (2013.01); *H01L 24/27* (2013.01); *H01L 24/29* (2013.01); *H01L 24/32* (2013.01); *H01L 24/83* (2013.01); *B29C 2035/0827* (2013.01); *B29K 2063/00* (2013.01); *B29K 2505/00* (2013.01); *B29K 2995/0005* (2013.01); *C09J 2301/208* (2020.08); *C09J 2301/314* (2020.08); *H01L 2224/293* (2013.01); *H01L 2224/2929* (2013.01); *H01L 2224/29076* (2013.01); *H01L 2224/29083* (2013.01); *H01L 2224/29499* (2013.01); *H01R 4/04* (2013.01); *H05K 3/323* (2013.01); *Y10T 428/24612* (2015.01)

(56) References Cited

U.S. PATENT DOCUMENTS

| | | | |
|---|---|---|---|
| 2007/0040153 A1* | 2/2007 | Jung | ........................ C08K 3/08 252/500 |
| 2007/0092698 A1 | 4/2007 | Ishida et al. | |
| 2008/0090943 A1 | 4/2008 | Xu et al. | |
| 2008/0303140 A1 | 12/2008 | Ohtani et al. | |
| 2009/0090545 A1* | 4/2009 | Usui | ...................... H01L 24/27 174/260 |
| 2010/0277885 A1 | 11/2010 | Tatsuzawa et al. | |
| 2011/0110066 A1 | 5/2011 | Yamada et al. | |
| 2014/0355226 A1 | 12/2014 | Kim et al. | |

FOREIGN PATENT DOCUMENTS

| | | |
|---|---|---|
| CN | 101432931 A | 5/2009 |
| CN | 101611066 A | 12/2009 |
| JP | 2000-178511 A | 6/2000 |
| JP | 2001-240816 A | 9/2001 |
| JP | 2003-220669 A | 8/2003 |
| JP | 2003-286456 A | 10/2003 |
| JP | 2003-286457 A | 10/2003 |
| JP | 2005-235530 A | 9/2005 |
| JP | 2005-314696 A | 11/2005 |
| JP | 2008-034232 A | 2/2008 |
| JP | 2008-214449 A | 9/2008 |
| JP | 2010-033793 A | 2/2010 |
| JP | 2011-070931 A | 4/2011 |
| JP | 2011-071108 A | 4/2011 |
| JP | 2014-044947 A | 3/2014 |
| JP | 2014-060150 A | 4/2014 |
| JP | 2016-201405 A | 12/2016 |
| KR | 10-2008-0111500 A | 12/2008 |
| KR | 10-2011-0049559 A | 5/2011 |
| KR | 2011-0122225 A | 11/2011 |
| WO | 2007/125993 A1 | 11/2007 |
| WO | 2011/059084 A1 | 5/2011 |
| WO | 2012/063554 A1 | 5/2012 |

OTHER PUBLICATIONS

Nov. 26, 2013 Search Report issued in International Application No. PCT/JP2013/072617.
Nov. 1, 2018 Office Action issued in U.S. Appl. No. 14/422,511.
Dec. 8, 2015 Taiwanese Office Action issued in Taiwanese Application No. 102130401.
May 17, 2016 Notification of Reasons for Refusal issued in Japanese Patent Application No. 2013-173698.
Jun. 22, 2016 Office Action issued in Chinese Patent Application No. 201380043932.8.
Jul. 1, 2016 Notice of Grounds for Rejection issued in Korean Patent Application No. 2015-7001171.
Jan. 30, 2019 Office Action Issued in Taiwanese Patent Application No. 106120899.
Jan. 22, 2018 Office Action Issued in Japanese Patent Application No. 2018-086174.
Nov. 26, 2013 International Search Report issued in International Patent Application No. PCT/JP2013/072571.
Apr. 11, 2016 Office Action issued in Korean Patent Application No. 10-2014-7035905.
May 17, 2016 Office Action issued in Japanese Patent Application No. 2013-173195.
May 26, 2016 Office Action issued in Chinese Patent Application No. 201380044397.8.
Oct. 31, 2016 Office Action issued in Korean Patent Application No. 10-2014-7035905.
Feb. 2, 2017 Office Action issued in Taiwanese Patent Application No. 102130402.
Mar. 16, 2017 Office Action issued in Chinese Patent Application No. 201380044397.8.
Jun. 16, 2017 Office Action issued in Japanese Patent Application No. 2016-201524.
Oct. 9, 2017 Office Action in Chinese Patent Application No. 201380044397.8.
Nov. 16, 2017 Office Action issued in U.S. Appl. No. 14/422,511.
Nov. 2, 2017 Office Action issued in Taiwanese Patent Application No. 102130402.
U.S. Appl. No. 14/422,511, filed Feb. 19, 2015 in the name of Shinohara.
Jan. 8, 2019 Office Action Issued in Japanese Patent Application No. 2018-086166.
Nov. 15, 2018 Office Action Issued in Korean Patent Application No. 10-2017-7006541.
Sep. 14, 2018 Office Action Issued in Korean Patent Application No. 10-2017-7006454.
Jun. 19, 2018 Office Action Issued in U.S. Appl. No. 14/422,511.
Aug. 6, 2018 Office Action issued in Taiwanese Patent Application No. 102130402.
Jun. 22, 2018 Office Action issued in Taiwanese Patent Application No. 106120898.
Jun. 22, 2018 Office Action issued in Taiwanese Patent Application No. 106120899.
May 6, 2019 Office Action Issued in U.S. Appl. No. 14/422,511.
Jun. 10, 2019 Office Action Issued in Japanese Patent Application No. 2018-86166.
Nov. 13, 2019 Office Action issued in Chinese Patent Application No. 201710413926.7.
Mar. 17, 2020 Office Action issued in Japanese Patent Application No. 2018-086166.
Nov. 1, 2019 Office Action issued in Chinese Patent Application No. 201710413040.2.
Dec. 24, 2019 Office Action issued in Japanese Patent Application No. 2018-086166.
Mar. 3, 2020 Office Action issued in Chinese Patent Application No. 201810699544.X.
Mar. 5, 2020 Office Action issued in Chinese Patent Application No. 201810699580.6.
Dec. 12, 2019 Office Action issued in Korean Patent Application No. 10-2019-7025499.
Oct. 9, 2019 Office Action issued in Japanese Patent Application No. 2018-086166.
Nov. 17, 2020 Office Action issued in Japanese Patent Application No. 2019-168643.
Dec. 10, 2020 Office Action issued in Chinese Patent Application No. 201810699580.6.
Jan. 26, 2021 Notification of Reason(s) for Refusal issued in Japanese Patent Application No. 2019-192686.

(56) References Cited

OTHER PUBLICATIONS

Jun. 18, 2020 Office Action issued in Taiwanese Patent Application No. 108111322.
Jun. 18, 2020 Office Action issued in Taiwanese Patent Application No. 106120899.
Jul. 22, 2020 Office Action issued in Japanese Patent Application No. 2018-086166.
Aug. 7, 2020 Office Action issued in Chinese Patent Application No. 201810699544.X (with partial translation).
Aug. 6, 2020 Office Action issued in Chinese Patent Application No. 201710413926.7.
Sep. 9, 2020 Office Action issued in Chinese Patent Application No. 201710413040.2.
Mar. 25, 2021 Office Action issued in Chinese Patent Application No. 201710413040.2.
Apr. 27, 2021 Trial and Appeal Decision issued in Japanese Patent Application No. 2018-086166.
Apr. 26, 2021 Office Action issued in Japanese Patent Application No. 2019-168643.
Jun. 1, 2021 Office Action issued in Japanese Patent Application No. 2019-168643.

\* cited by examiner

METHOD OF PRODUCING ANISOTROPIC CONDUCTIVE FILM AND ANISOTROPIC CONDUCTIVE FILM

TECHNICAL FIELD

The present invention relates to a method of producing an anisotropic conductive film and the anisotropic conductive film.

BACKGROUND ART

Anisotropic conductive films are widely used to mount electronic components such as IC chips. In recent years, for the purpose of improvement in connection reliability and insulating properties, improvement in particle capturing efficiency, a reduction in production cost, etc., an anisotropic conductive film in which conductive particles for anisotropic conductive connection are arranged in a single layer within an insulating adhesive layer has been proposed from the viewpoint of application to high-density mounting (Patent Literature 1).

This anisotropic conductive film is produced as follows. First, a transfer die having openings is used to hold conductive particles in the openings, and an adhesive film having an adhesive layer for transfer formed thereon is pressed against the transfer die to primary-transfer the conductive particles to the adhesive layer. Next, a polymer film serving as a component of the anisotropic conductive film is pressed against the conductive particles adhering to the adhesive layer, and heat and pressure are applied thereto to secondary-transfer the conductive particles to the surface of the polymer film. Next, an adhesive layer is formed on the surface of the polymer film on which the conductive particles have been secondary-transferred so as to cover the conductive particles, whereby the anisotropic conductive film is produced.

CITATION LIST

Patent Literature

Patent Literature 1: Japanese Patent Application Laid-Open No. 2010-33793

SUMMARY OF INVENTION

Technical Problem

In the anisotropic conductive film in Patent Literature 1 that is produced using the transfer die having openings, the connection reliability, insulating properties, and particle capturing efficiency of the anisotropic conductive film may be expected to be improved to some extent so long as the primary transfer and the secondary transfer have been successfully done. However, generally, the adhesive film used for the primary transfer has relatively low adhesion in order to facilitate the secondary transfer, and the area of contact between the adhesive film and the conductive particles is small. Therefore, it is feared that the total operation efficiency in the operation of the primary transfer and the operation of the secondary transfer may deteriorate because of, for example, the occurrence of conductive particles not primary-transferred, detachment of conductive particles from the adhesive film after the primary transfer, and positional displacement of conductive particles on the adhesive film.

When the adhesion of the adhesive film is increased to some extent to allow the conductive particles to be stably held in the adhesive film in order for the primary transfer operation to proceed faster and more smoothly, secondary transfer of the conductive particles to the polymer film becomes difficult. When the film properties of the polymer film are enhanced in order to avoid the above problem, another problem arises in that the conduction resistance of the anisotropic conductive film increases and its conduction reliability is also reduced. When an anisotropic conductive film is produced using the transfer die having openings described above, the primary transfer and the secondary transfer may not in fact always be successfully done. Therefore, at present, there still is a strong demand for an anisotropic conductive film having favorable connection reliability, favorable insulating properties, and favorable particle capturing efficiency simultaneously.

It is an object of the present invention to solve the foregoing problems in the conventional technology. More specifically, the object is to allow an anisotropic conductive film having favorable connection reliability, favorable insulating properties, and favorable particle capturing efficiency to be produced when producing an anisotropic conductive film including conductive particles arranged in a single layer utilizing a transfer die having openings.

Solution to Problem

The present inventor has found that the above object can be achieved by the following method, and thus the present invention has been completed. Specifically, a light-transmitting transfer die having openings is used as the transfer die for producing an anisotropic conductive film. Conductive particles arranged in a single layer are transferred to an insulating resin layer used for the anisotropic conductive film directly from the transfer die without primary transfer of the conductive particles to an adhesive film. The conductive particles are transferred such that the thickness of the insulating resin layer in central regions between adjacent ones of the conductive particles is smaller than the thickness of the insulating resin layer in regions in proximity to the conductive particles. The insulating resin holding the conductive particles is irradiated with ultraviolet rays through the light-transmitting transfer die to photo-cure the insulating resin, and then the insulating resin layer in which the conductive particles are arranged in a single layer is sandwiched between insulating resin layers functioning as adhesive layers.

Accordingly, the present invention provides a method of producing an anisotropic conductive film having a three-layer structure in which a first connection layer is held between a second connection layer and a third connection layer, which are each formed mainly of an insulating resin. The method of producing includes the following steps (A) to (F).

\<Step (A)\>

The step of disposing conductive particles within openings formed in a light-transmitting transfer die and placing, on the transfer die, a photopolymerizable insulating resin layer formed on a release film such that the photopolymerizable insulating resin layer faces a surface of the transfer die on which the openings are formed.

\<Step (B)\>

The step of applying pressure to the photopolymerizable insulating resin layer through the release film to squeeze a photopolymerizable insulating resin into the openings to thereby transfer the conductive particles onto a surface of the photopolymerizable insulating resin layer, whereby a first connection layer is formed, the first connection layer having a structure in which the conductive particles are arranged in a single layer in a plane direction of the photopolymerizable insulating resin layer and in which the photopolymerizable insulating resin layer in central regions between adjacent ones of the conductive particles has a thickness smaller than that of the photopolymerizable insulating resin layer in regions in proximity to the conductive particles.

<Step (C)>

The step of irradiating the first connection layer with ultraviolet rays through the light-transmitting transfer die.

<Step (D)>

The step of removing the release film from the first connection layer.

<Step (E)>

The step of forming the second connection layer, being formed mainly of the insulating resin, on a surface of the first connection layer that is opposite to the light-transmitting transfer die.

<Step (F)>

The step of forming the third connection layer, being formed mainly of the insulating resin, on a surface of the first connection layer that is opposite to the second connection layer.

The present invention also provides a method of connecting a first electronic component to a second electronic component by anisotropic conductive connection using the anisotropic conductive film obtained by the above-described production method, the method including temporarily applying the anisotropic conductive film to the second electronic component through the third connection layer of the anisotropic conductive film, mounting the first electronic component on the temporarily applied anisotropic conductive film, and performing thermocompression bonding through the first electronic component. The present invention also provides an anisotropic conductive connection structure obtained by this connection method.

The present invention also provides an anisotropic conductive film having a three-layer structure in which a first connection layer is held between a second connection layer and a third connection layer, which are each formed mainly of an insulating resin, wherein a boundary between the first connection layer and the third connection layer is undulated, the first connection layer has a structure in which conductive particles are arranged on a side facing the third connection layer in a single layer in a plane direction of an insulating resin layer, and the thickness of the insulating resin layer in central regions between adjacent ones of the conductive particles is smaller than the thickness of the insulating resin layer in regions in proximity to the conductive particles.

In a preferred embodiment of the anisotropic conductive film, the first connection layer is a thermal- or photo-radical polymerizable resin layer containing an acrylate compound and a thermal- or photo-radical polymerization initiator or a layer obtained by subjecting the thermal- or photo-radical polymerizable resin layer to thermal- or photo-radical polymerization; or a thermal- or photo-cationic or anionic polymerizable resin layer containing an epoxy compound and a thermal- or photo-cationic or anionic polymerization initiator or a layer obtained by subjecting the thermal- or photo-cationic or anionic polymerizable resin layer to thermal- or photo-cationic or anionic polymerization. In another preferred embodiment, the conductive particles dig into the third connection layer. In another preferred embodiment, the degree of cure of the first connection layer in regions positioned between the conductive particles and a surface of the first connection layer that faces the second connection layer is lower than the degree of cure of the first connection layer in regions positioned between adjacent ones of the conductive particles. In another preferred embodiment, the minimum melt viscosity of the first connection layer is higher than the minimum melt viscosity of the second connection layer and the minimum melt viscosity of the third connection layer. In another preferred embodiment, the ratios of the minimum melt viscosity of the first connection layer to the minimum melt viscosity of the second connection layer and to the minimum melt viscosity of the third connection layer are each 1:4 to 400.

Advantageous Effects of Invention

The present invention is a method of producing an anisotropic conductive film having a three-layer structure in which a first connection layer is held between an insulating second connection layer and an insulating third connection layer. In this production method, when the anisotropic conductive film is produced using the transfer die having openings, the conductive particles arranged in a single layer in the transfer die are transferred directly from the transfer die to the photopolymerizable insulating resin layer used for the first connection layer constituting the anisotropic conductive film without primary transfer to an adhesive film. In addition, the conductive particles are transferred such that the thickness of the photopolymerizable insulating resin layer in central regions between adjacent ones of the conductive particles is smaller than the thickness of the photopolymerizable insulating resin layer in regions in proximity to the conductive particles (i. e., such that the conductive particles protrude from the first connection layer). When the protrusions are disposed on the side facing the third connection layer to be placed on, for example, a circuit board on which an electronic component such as an IC chip is mounted, particle capturing efficiency can be improved. By irradiating the photopolymerizable insulating resin layer with ultraviolet rays through the light-transmitting transfer die, the photopolymerizable insulating resin layer which holds the conductive particles and is to become the first connection layer can be photo-cured while being held in the transfer die, and the degree of cure of the photopolymerizable insulating resin layer in potions shaded from the ultraviolet rays by the conductive particles can be relatively reduced. In this manner, while excessive movement of the conductive particles in a plane direction is prevented, the ease of pushing the conductive particles can be improved, and favorable connection reliability, favorable insulating properties, and favorable particle capturing efficiency can be achieved.

DESCRIPTION OF EMBODIMENTS

<<Method of Producing Anisotropic Conductive Film>>

Each of steps in the anisotropic conductive film production method of the present invention will be described in detail.

An example of the anisotropic conductive film production method of the present invention will next be described. This production method includes the following steps (A) to (F). These steps will be described one by one.

<Step (A)>

Figure 1A:
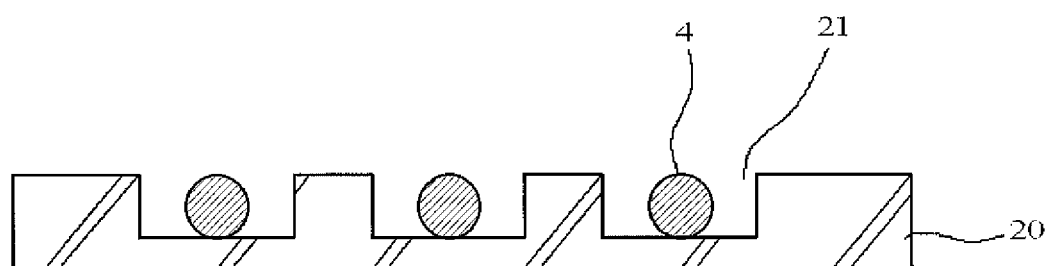
FIG. 1A is a diagram illustrating step (A) in an anisotropic conductive film production method of the present invention.
Figure 1B:
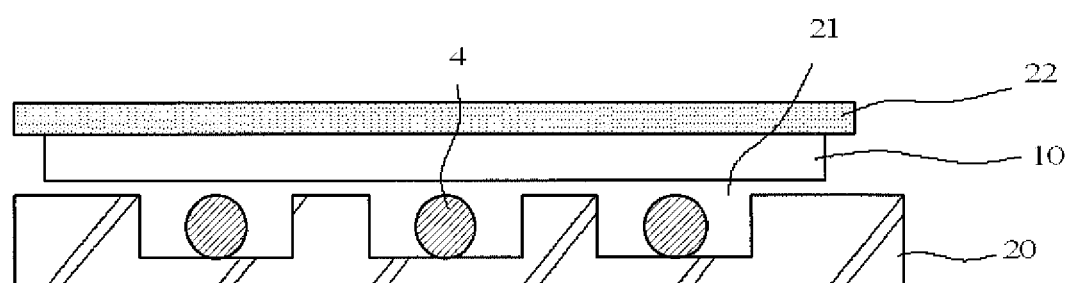
FIG. 1B is a diagram illustrating step (A) in the anisotropic conductive film production method of the present invention.

As shown in FIG. 1A, conductive particles 4 are disposed in openings 21 formed in a light-transmitting transfer die 20. Then a photopolymerizable insulating resin layer 10 formed on a release film 22 such as a release-treated polyethylene terephthalate film is placed on the transfer die 20 so as to face the surface of the transfer die 20 that has the openings 21 formed thereon, as shown in FIG. 1B.

The light-transmitting property of the transfer die 20 means the property of allowing ultraviolet rays to pass therethrough. No particular limitation is imposed on the level of the light-transmitting property. From the viewpoint of allowing photopolymerization to proceed rapidly, the ultraviolet transmittance measured using a spectrophotometer (measurement wavelength: 365 nm, optical path length: 1.0 cm) is preferably 70% or higher.

The transfer die 20 is prepared by forming the openings in a transparent inorganic material such as ultraviolet transmitting glass or an organic material such as polymethacrylate using a known opening forming method such as photolithography. The above transfer die 20 may have a plate-like shape, a roll-like shape, etc.

The openings 21 of the transfer die 20 are used to accommodate the conductive particles thereinside. Examples of the shape of the openings 21 may include a cylindrical shape, polygonal prism shapes such as a quadrangular prism shape, and pyramid shapes such as a quadrangular pyramid shape.

Preferably, the arrangement of the openings 21 is a regular arrangement such as a lattice arrangement or a staggered arrangement.

The ratio of the average particle diameter of the conductive particles 4 to the depth of the openings 21 (=the average particle diameter of the conductive particles/the depth of the openings) is preferably 0.4 to 3.0 and more preferably 0.5 to 1.5, from the viewpoint of the balance between improvement in transferability and retainability of the conductive particles.

The ratio of the diameter of the openings 21 to the average particle diameter of the conductive particles 4 (=the diameter of the openings/the average particle diameter of the conductive particles) is preferably 1.1 to 2.0 and more preferably 1.3 to 1.8, from the viewpoint of the balance between, for example, the ease of accommodation of the conductive particles and the ease of squeezing the insulating resin into the openings.

The diameter and depth of the openings 21 of the transfer die 20 can be measured using a laser microscope.

No particular limitation is imposed on the method of accommodating the conductive particles 4 within the openings 21 of the transfer die 20, and any known method can be used. For example, dry powder of the conductive particles or a dispersion prepared by dispersing the powder in a solvent is sprinkled on or applied to an opening-formed surface of the transfer die 20, and then the opening-formed surface is wiped with, for example, a brush or a blade.

<Step (B)>

Figure 2A:
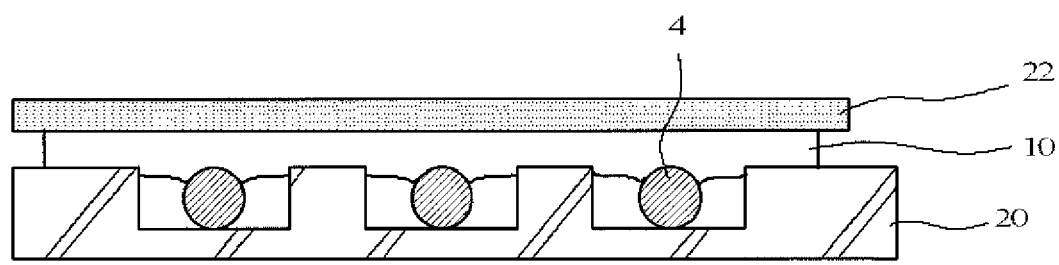
FIG. 2A is a diagram illustrating step (B) in the anisotropic conductive film production method of the present invention.
Figure 2B:
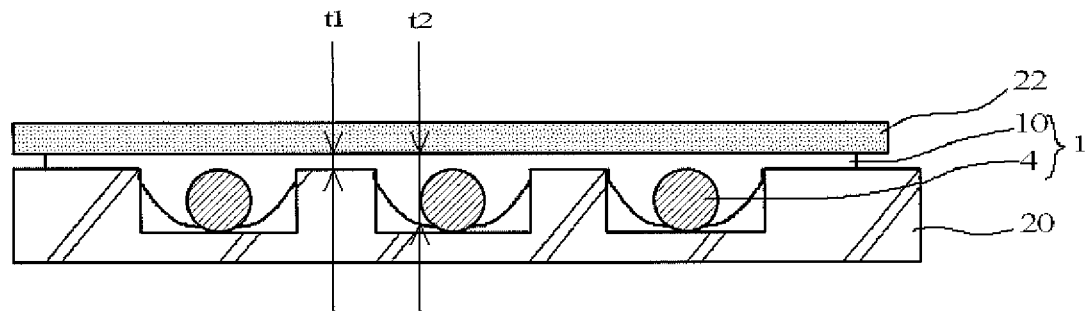
FIG. 2B is a diagram illustrating step (B) in the anisotropic conductive film production method of the present invention.

Next, as shown in FIG. 2A, pressure is applied to the photopolymerizable insulating resin layer 10 through the release film 22 to squeeze the photopolymerizable insulating resin into the openings 21, so that the conductive particles 4 are transferred to the surface of the photopolymerizable insulating resin layer 10 so as to be embedded therein. A first connection layer 1 is thereby formed as shown in FIG. 2B. Specifically, the first connection layer 1 has a structure in which the conductive particles 4 are arranged in a single layer in a plane direction of the photopolymerizable insulating resin layer 10. In the first connection layer 1, the thickness t1 of the photopolymerizable insulating resin layer in central regions between adjacent ones of the conductive particles 4 is smaller than the thickness t2 of the photopolymerizable insulating resin layer in regions in proximity to the conductive particles 4.

If the thickness t1 of the photopolymerizable insulating resin layer in the central regions between adjacent ones of the conductive particles 4 is excessively smaller than the thickness t2 of the photopolymerizable insulating resin layer in the regions in proximity to the conductive particles 4, the conductive particles 4 tend to move excessively during anisotropic conductive connection. If the thickness t1 is too large, the ease of pushing the conductive particles tends to deteriorate. In both the cases, it is feared that particle capturing efficiency may deteriorate. Therefore, the ratio of the thickness t1 to the thickness t2 is preferably 0.2 to 0.8 and more preferably 0.3 to 0.7.

If the absolute value of the thickness t1 of the photopolymerizable insulating resin layer is too small, it is feared that the first connection layer 1 may be difficult to form. Therefore, the absolute thickness is 0.5 μm or more. If the absolute thickness is too large, it is feared that the insulating resin layer may not be easily eliminated from connection regions during anisotropic conductive connection and this may cause connection failure. Therefore, the absolute thickness is 6 μm or less.

The central region between adjacent conductive particles 4 is a region which includes the midpoint of the distance between the adjacent conductive particles 4 and in which the thickness of the photopolymerizable insulating resin layer 10 formed is small. The region in proximity to a conductive particle 4 means a location near line segments in contact with the conductive particle 4 and extending in the direction of the thickness of the first connection layer 1.

The thickness t1 can be adjusted within above numerical range by controlling the diameter of the openings, the depth of the openings, the diameter of the conductive particles, the intervals between the openings, a pressure value, the composition of the photopolymerizable insulating resin, etc.

Figure 8:
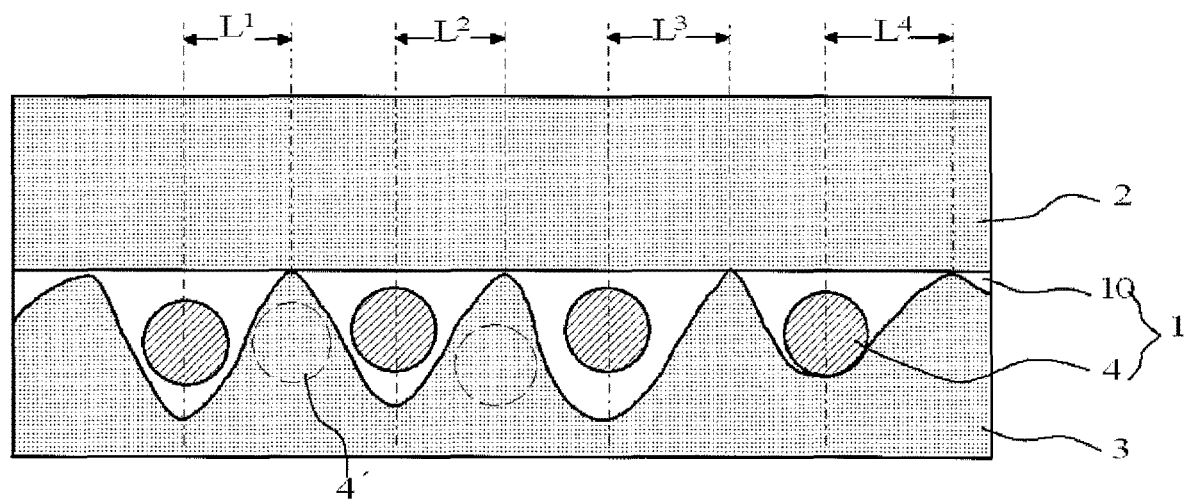
FIG. 8 is a cross-sectional view of the anisotropic conductive film of the present invention.

When the thickness of the resin layer containing the conductive particles varies largely in a plane direction and therefore the resin layer is divided into sections as shown in FIG. 8, the thickness of the insulating resin layer between conductive particles 4 can be substantially zero (0). Substantially zero means that the divided sections of the insulating resin layer that contain the conductive particles are present independently. In such a case, to achieve favorable connection reliability, favorable insulating properties, and favorable particle capturing efficiency, it is preferable to control the minimum distances $L^1, L^2, L^3, L^4 \ldots$ between the perpendiculars passing through the centers of the conductive particles 4 and the points at which the thickness of the insulating resin layer is smallest. Specifically, when the minimum distances $L^1, L^2, L^3, L^4 \ldots$ are large, the relative amount of the resin in the first connection layer 1 increases, and productivity is improved. In addition, the flow of the conductive particles 4 can be suppressed. When the minimum distances $L^1, L^2, L^3, L^4 \ldots$ are small, the relative amount of the resin in the first connection layer 1 decreases, and the distances between the particles can be easily controlled. In other words, the accuracy of the positional adjustment of the conductive particles can be improved. Preferred minimum distances $L^1, L^2, L^3, L^4 \ldots$ are within the range of preferably more than 0.5 times and less than 1.5 times the particle diameter of the conductive particles 4.

Various methods can be used as a method of reducing the thickness of the insulating resin layer between conductive particles 4 to substantially zero, so long as the effects of the invention are not impaired. For example, one usable method includes scraping the surface of the photopolymerizable insulating resin layer 10 formed in step (B) using, for example, a squeegee until the surface of the transfer die 20 appears.

The conductive particles 4 may be embedded in the first connection layer 1 as shown in FIG. 8. The degree of embedment, i.e., whether the depth of embedment is small or large, varies depending on the viscosity of the material of the first connection layer when it is formed, the shape and size of the openings of the transfer die in which the conductive particles are arranged, etc. Particularly, the degree of embedment can be controlled by changing the relation between the bottom diameter and opening diameter of the openings. Preferably, for example, the bottom diameter is set to be 1.1 times or more and less than 2 times the diameter of the conductive particles, and the opening diameter is set to be 1.3 times or more and less than 3 times the diameter of the conductive particles.

Conductive particles 4' shown by dotted lines in FIG. 8 may be present in a third connection layer 3, so long as the effects of the present invention are not impaired. Generally, the ratio of the number of conductive particles present in the third connection layer 3 to the total number of conductive particles is preferably 1 to 50% and more preferably 5 to 40%. Particularly, when the number of conductive particles 4 in the first connection layer 1 is substantially the same as the number of conductive particles 4' in the third connection layer 3, adjacent particles are present in different resin layers, and therefore it is expected to have such an effect that a high conductive particle density can be achieved locally while connection of a plurality of conductive particles is suppressed. Therefore, as for the particles arranged in a plane, the present invention also includes an embodiment in which conductive particles adjacent to given conductive particles are present and arranged in a layer different from the layer in which the given conductive particles are present.

The conductive particles 4' present in the third connection layer 3 are obtained as follows. With conductive particles present on the surface of the transfer die in addition to the conductive particles accommodated within the openings of the transfer die, the operation for forming the first connection layer is performed, and then the operation for forming the third connection layer 3 is performed. It is practically difficult to avoid the presence of a certain amount or more of conductive particles on the surface etc. of the transfer die other than the openings as described above. So long as these particles do not have such an adverse effect that the performance of a product is impaired, these particles can reduce the occurrence of a defective product and therefore contribute to an improvement in yield.

<Step (C)>

Figure 3:
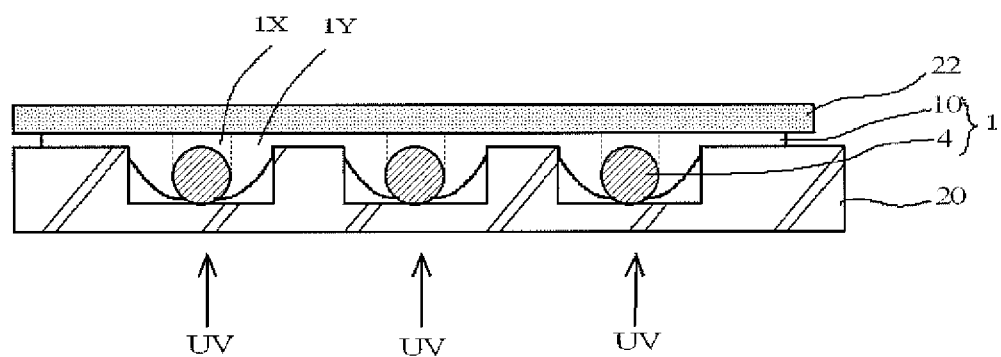
FIG. 3 is a diagram illustrating step (C) in the anisotropic conductive film production method of the present invention.

Next, as shown in FIG. 3, the first connection layer 1 is irradiated with ultraviolet rays through the light-transmitting transfer die 20. The photopolymerizable insulating resin 10 used for the first connection layer 1 is thereby polymerized and cured, so that the conductive particles 4 can be stably held in the first connection layer 1. In addition, the degree of cure of the photopolymerizable insulating resin in regions 1X that are shaded from the ultraviolet rays by the conductive particles 4 can be made lower than the degree of cure in regions 1Y around the regions 1X, and the ease of pushing the conductive particles 4 during anisotropic conductive connection can be improved. In this manner, while the positional displacement of the conductive particles during anisotropic conductive connection is prevented (i.e., the particle capturing efficiency is improved), the ease of pushing the conductive particles can be improved, and the value of conduction resistance can be reduced, so that favorable conduction reliability can be achieved.

The conditions of the ultraviolet irradiation can be appropriately selected from known conditions.

The degree of cure is a value defined as the rate of reduction in the amount of functional groups (for example, vinyl groups) that contribute to polymerization. Specifically, when the amount of vinyl groups present after curing is 20% of that before curing, the degree of cure is 80%. The amount of vinyl groups present can be measured by analyzing the characteristic absorption of vinyl groups in an infrared absorption spectrum.

The above-defined degree of cure in the regions 1X is preferably 40 to 80%, and the degree of cure in the regions 1Y is preferably 70 to 100%.

Preferably, the minimum melt viscosity of the first connection layer 1 measured by a rheometer is higher than the minimum melt viscosity of a second connection layer 2 and the minimum melt viscosity of the third connection layer 3. Specifically, if the value of [the minimum melt viscosity (mPa·s) of the first connection layer 1]/[the minimum melt viscosity (mPa·s) of the second connection layer 2 or the third connection layer 3] is too small, the particle capturing efficiency tends to deteriorate, and this causes an increase in the probability of occurrence of a short circuit. If the value is too large, the conduction reliability tends to deteriorate. Therefore, the above value is preferably 1 to 1,000 and more preferably 4 to 400. A preferred minimum melt viscosity of each of the first connection layer 1, the second connection layer 2, and the third connection layer 3 will be described. If the minimum melt viscosity of the first connection layer 1 is too low, the particle capturing efficiency tends to deteriorate. If the minimum melt viscosity thereof is too high, the value of the conduction resistance tends to become high. Therefore, the minimum melt viscosity of the first connection layer 1 is preferably 100 to 100,000 mPa·s and more preferably 500 to 50,000 mPa·s. If the minimum melt viscosity of the second connection layer 2 and the third connection layer 3 is too low, the resin tends to be squeezed out when the film is wound into a reel. If the minimum melt viscosity is too high, the value of the conduction resistance tends to become high. Therefore, the minimum melt viscosity of the second connection layer 2 and the third connection layer 3 is preferably 0.1 to 10,000 mPa·s and more preferably 1 to 1,000 mPa·s.

<Step (D)>

Figure 4:
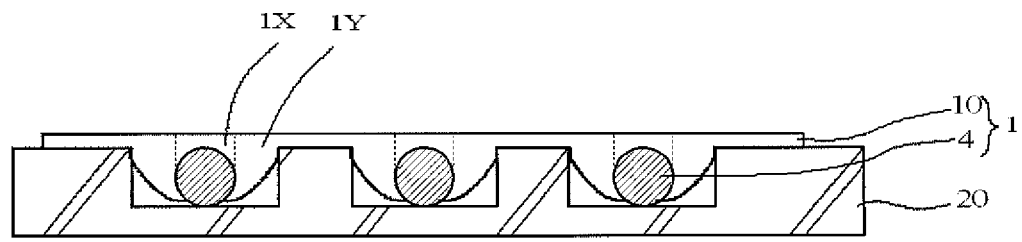
FIG. 4 is a diagram illustrating step (D) in the anisotropic conductive film production method of the present invention.

Next, as shown in FIG. 4, the release film 22 is removed from the first connection layer 1. No particular limitation is imposed on the removing method.

<Step (E)>

Figure 5:
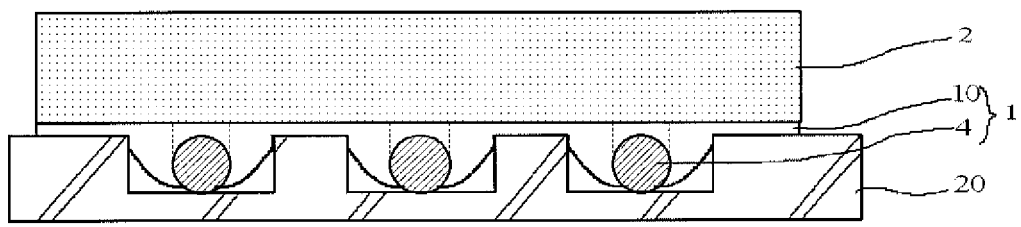
FIG. 5 is a diagram illustrating step (E) in the anisotropic conductive film production method of the present invention.

Then, as shown in FIG. 5, the second connection layer 2 formed mainly of an insulating resin is formed on the surface of the first connection layer 1 that is opposite to the light-transmitting transfer die 20.

The second connection layer 2 is located on the surface of the first connection layer 1 from which no conductive particles 4 protrude and is generally a layer disposed on a terminal side for, for example, bumps of an IC chip on which high positional alignment accuracy is required. The regions 1X in the first connection layer 1 that are located between the second connection layer 2 and the conductive particles 4 have a low degree of cure, and this degree of cure is lower than the degree of cure of the other regions, i.e., the regions 1Y. Therefore, the regions 1X are easily eliminated during anisotropic conductive connection. However, since the conductive particles are surrounded by the regions 1Y with a high degree of cure, unintended movement of the conductive particles is less likely to occur. Accordingly, while the positional displacement of the conductive particles is prevented (i.e., the particle capturing efficiency is improved), the ease of pushing the conductive particles can be improved, and the value of the conduction resistance can be reduced. In addition, favorable conduction reliability can be achieved.

If the thickness of the second connection layer 2 is too small, it is feared that conduction failure may occur due to lack of the amount of resin for filling. If the thickness is too large, it is feared that the resin may be squeezed out during compression bonding, so that the compression bonding machine may become dirty. Therefore, the thickness of the second connection layer 2 is preferably 5 to 20 μm and more preferably 8 to 15 μm.

<Step (F)>

Figure 6:
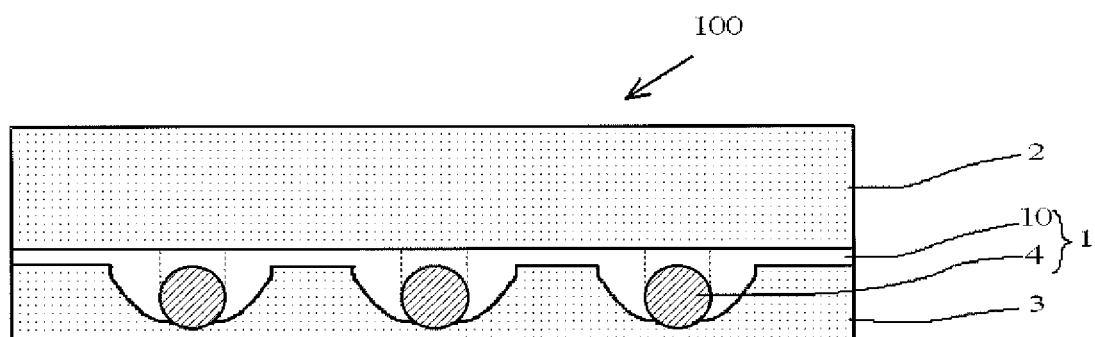
FIG. 6 is a cross-sectional view of the anisotropic conductive film of the present invention obtained by step (F) in the anisotropic conductive film production method of the present invention.

Next, as shown in FIG. 6, the third connection layer 3 formed mainly of an insulating resin is formed on the surface of the first connection layer 1 that is opposite to the second connection layer 2 (i.e., the surface from which the conductive particles protrude) to thereby obtain an anisotropic conductive film 100. In this manner, the first connection layer and the third connection layer are formed with an undulated boundary therebetween. In other words, the boundary has an undulated shape or a bumpy shape. When such an undulated shape is applied to layers present in the film as described above, the probability of an increase in the area of contact with mainly a bump during bonding can be increased, so that it is expected to improve the bonding strength. When the undulation described above is present, it is more likely to obtain the above-described state in which particles are present in the third connection layer 3. This is because particles present in unridged portions of the first connection layer 1 move to the third connection layer 3 during the process of forming the third connection layer 3.

The third connection layer 3 is generally disposed on a terminal side for, for example, solid electrodes of a circuit board on which relatively high alignment accuracy is not required. The third connection layer 3 is disposed on the side on which the conductive particles 4 protrude from the first connection layer 1. Therefore, the conductive particles 4 in the first connection layer 1 immediately bump into electrodes of, for example, a circuit board and are deformed during anisotropic conductive connection, so that the conductive particles 4 are unlikely to move to unintended positions even when the insulating resins flow during anisotropic conductive connection. Accordingly, while the positional displacement of the conductive particles is prevented (i.e., the particle capturing efficiency is improved), the ease of pushing the conductive particles can be improved, and the value of the conduction resistance can be reduced. In addition, favorable conduction reliability can be achieved.

If the thickness of the third connection layer 3 is too small, it is feared that application failure may occur when the film is temporarily applied to a second electronic component. If the thickness is too large, the value of the conduction resistance tends to become large. Therefore, the thickness of the third connection layer 3 is preferably 0.5 to 6 μm and more preferably 1 to 5 μm.

<<Materials Constituting First, Second and Third Connection Layers and Conductive Particles>>

The anisotropic conductive film 100 shown in FIG. 6 and obtained by the production method of the present invention has a three-layer structure in which the first connection layer 1 is sandwiched between the second connection layer 2 and the third connection layer 3 which are each formed mainly of an insulating resin, as described above. The first connection layer 1 has a structure in which the conductive particles 4 are arranged in a single layer in a plane direction so as to protrude from the photopolymerizable insulating resin layer 10 toward the third connection layer 3. The conductive particles 4 are disposed according to the pattern of the openings of the transfer die used to produce the anisotropic conductive film 100. In this case, it is preferable that the conductive particles be arranged uniformly, i.e., arranged regularly in the plane direction at regular intervals. In the structure of the first connection layer 1, the thickness t1 of the photopolymerizable insulating resin layer in the central regions between adjacent ones of the conductive particles 4 is smaller than the thickness t2 of the photopolymerizable insulating resin layer in the regions in proximity to the conductive particles 4. Therefore, a conductive particle 4 not located between terminals to be connected and therefore not used exhibits the behavior shown in FIG. 7. Specifically, portions of the insulating resin layer that are disposed between conductive particles 4 and have a relatively small thickness are melted and cut by heat and pressure applied during anisotropic conductive connection and cover the conductive particles 4 to thereby form a coating layer 1d. Therefore, the occurrence of a short circuit is suppressed significantly.

<First Connection Layer>

Any known insulating resin layer can be appropriately used as the photopolymerizable insulating resin layer 10 constituting the above-described first connection layer 1. For example, the insulating resin layer used can be a thermal- or photo-radical polymerizable resin layer containing an acrylate compound and a thermal- or photo-radical polymerization initiator or a layer obtained by subjecting the thermal- or photo-radical polymerizable resin layer to thermal- or photo-radical polymerization; or a thermal- or photo-cationic or anionic polymerizable resin layer containing an epoxy compound and a thermal- or photo-cationic or anionic polymerization initiator or a layer obtained by subjecting the thermal- or photo-cationic or anionic polymerizable resin layer to thermal- or photo-cationic or anionic polymerization.

Of these, a thermal-radical polymerizable resin layer containing an acrylate compound and a thermal-radical radical polymerization initiator may be used as the photopolymerizable insulating resin layer 10 constituting the first connection layer 1. However, it is preferable to use a photo-radical polymerizable resin layer containing an acrylate compound and a photo-radical polymerization initiator. In this case, the first connection layer 1 can be formed by irradiating the photo-radical polymerizable resin layer with ultraviolet rays to subject the photo-radical polymerizable resin layer to photo-radical polymerization.

<Acrylate Compound>

The acrylate compound used for the photopolymerizable insulating resin layer 10 constituting the first connection layer 1 may be any known radical polymerizable acrylate. For example, a monofunctional (meth)acrylate (the term (meth)acrylate is meant to include acrylate and methacrylate) or a bifunctional or higher functional (meth)acrylate may be used. In the present invention, it is preferable to use a polyfunctional (meth)acrylate as at least part of an acrylic monomer, in order to obtain a thermosetting adhesive.

Examples of the monofunctional (meth)acrylate may include methyl (meth)acrylate, ethyl (meth)acrylate, n-propyl (meth)acrylate, i-propyl (meth)acrylate, n-butyl (meth)acrylate, i-butyl (meth)acrylate, t-butyl (meth)acrylate, 2-methylbutyl (meth)acrylate, n-pentyl (meth)acrylate, n-hexyl (meth)acrylate, n-heptyl (meth)acrylate, 2-methylhexyl (meth)acrylate, 2-ethylhexyl (meth)acrylate, 2-butylhexyl (meth)acrylate, isooctyl (meth)acrylate, isopentyl (meth)acrylate, isononyl (meth)acrylate, isodecyl (meth)acrylate, isobornyl (meth)acrylate, cyclohexyl (meth)acrylate, benzyl (meth)acrylate, phenoxy (meth)acrylate, n-nonyl (meth)acrylate, n-decyl (meth)acrylate, lauryl (meth)acrylate, hexadecyl (meth)acrylate, stearyl (meth)acrylate, and morpholine-4-yl (meth)acrylate. Examples of the bifunctional (meth)acrylate may include bisphenol F EO-modified di(meth)acrylate, bisphenol A EO-modified di(meth)acrylate, polypropylene glycol di(meth)acrylate, polyethylene glycol di(meth)acrylate, tricyclodecane dimethylol di(meth)acrylate, and dicyclopentadiene di(meth)acrylate. Examples of the trifunctional (meth)acrylate may include trimethylolpropane tri(meth)acrylate, trimethylolpropane PO-modified tri(meth)acrylate, and isocyanuric acid ED-modified tri(meth)acrylate. Examples of the tetrafunctional or higher functional (meth)acrylate may include dipentaerythritol penta(meth)acrylate, pentaerythritol hexa(meth)acrylate, pentaerythritol tetra(meth)acrylate, and ditrimethylolpropane tetraacrylate. In addition, polyfunctional urethane (meth)acrylates can be used. Specific examples include: M1100, M1200, M1210, and M1600 (TOAGOSEI Co., Ltd.); and AH-600 and AT-600 (KYOEISHA CHEMICAL Co., Ltd.).

If the content of the acrylate compound in the photopolymerizable insulating resin layer 10 constituting the first connection layer 1 is too small, the difference in minimum melt viscosity between the first connection layer 1 and the second connection layer 2 tends to become small. If the content is too large, curing shrinkage tends to become large, so that workability deteriorates. Therefore, the content of the acrylate compound is preferably 2 to 70% by mass and more preferably 10 to 50% by mass.

<Photo-radical Polymerization Initiator>

The photo-radical polymerization initiator used may be appropriately selected from known photo-radical polymerization initiators. Examples of such photo-radical polymerization initiators may include acetophenone-based photopolymerization initiators, benzyl ketal-based photopolymerization initiators, and phosphorus-based photopolymerization initiators. Specific examples of the acetophenone-based photopolymerization initiators may include 2-hydroxy-2-cyclohexylacetophenone (IRGACURE 184, manufactured by BASF Japan), α-hydroxy-α,α'-dimethylacetophenone (DAROCUR 1173, manufactured by BASF Japan), 2,2-dimethoxy-2-phenylacetophenone (IRGACURE 651, manufactured by BASF Japan), 4-(2-hydroxyethoxy)phenyl(2-hydroxy-2-propyl)ketone (DAROCUR 2959, manufactured by BASF Japan), and 2-hydroxy-1-{4-[2-hydroxy-2-methyl-propionyl]-benzyl}phenyl)-2-methyl-propane-1-one (IRGACURE 127, manufactured by BASF Japan). Specific examples of the benzyl ketal-based photopolymerization initiators may include benzophenone, fluorenone, dibenzosuberone, 4-aminobenzophenone, 4,4'-diaminobenzophenone, 4-hydroxybenzophenone, 4-chlorobenzophenone, and 4,4'-dichlorobenzophenone. In addition, 2-benzyl-2-dimethylamino-1-(4-morpholinophenyl)-1-butanone-1 (IRGACURE 369, manufactured by BASF Japan) can also be used. Specific examples of the phosphorus-based photopolymerization initiator may include bis(2,4,6-trimethylbenzoyl)-phenylphosphine oxide (IRGACURE 819, manufactured by BASF Japan) and (2,4,6-trimethylbenzoyl-diphenylphosphine oxide (DAROCUR TPO, manufactured by BASF Japan).

If the amount used of the photo-radical polymerization initiator based on 100 parts by mass of the acrylate compound is too small, photo-radical polymerization tends not to proceed sufficiently. If the amount is too large, it is feared that the photo-radical polymerization initiator may cause a reduction in stiffness. Therefore the amount used of the photo-radical polymerization initiator is preferably 0.1 to 25 parts by mass and more preferably 0.5 to 15 parts by mass based on 100 parts by mass of the acrylate compound.

<Thermal-radical Polymerization Initiator>

Examples of the thermal-radical polymerization initiator may include organic peroxides and azo-based compounds. Of these, organic peroxides that do not generate nitrogen causing air bubbles can be preferably used.

Examples of the organic peroxides may include methyl ethyl ketone peroxide, cyclohexanone peroxide, methylcyclohexanone peroxide, acetylacetone peroxide, 1,1-bis(tert-butylperoxy)3,3,5-trimethylcyclohexane, 1,1-bis(tert-butylperoxy)cyclohexane, 1,1-bis(tert-hexylperoxy)3,3,5-trimethylcyclohexane, 1,1-bis(tert-hexylperoxy)cyclohexane, 1,1-bis(tert-butylperoxy)cyclododecane, isobutyl peroxide, lauroyl peroxide, succinic acid peroxide, 3,5,5-trimethylhexanoyl peroxide, benzoyl peroxide, octanoyl peroxide, stearoyl peroxide, diisopropyl peroxy dicarbonate, di-n-propyl peroxy dicarbonate, di-2-ethylhexyl peroxy dicarbonate, di-2-ethoxyethyl peroxy dicarbonate, di-2-methoxybutyl peroxy dicarbonate, bis-(4-tert-butylcyclohexyl)peroxy dicarbonate, (α,α-bis-neodecanoylperoxy)diisopropyl benzene, peroxyneodecanoic acid cumyl ester, peroxyneodecanoic acid octyl ester, peroxyneodecanoic acid hexyl ester, peroxyneodecanoic acid-tert-butyl ester, peroxypivalic acid-tert-hexyl ester, peroxypivalic acid-tert-butyl ester, 2,5-dimethyl-2,5-bis(2-ethylhexanoylperoxy)hexane, 1,1,3,3- tetramethylbutylperoxy-2-ethylhexanoate, peroxy-2-ethylhexanoic acid-tert-hexyl ester, peroxy-2-ethylhexanoic acid-tert-butyl ester, peroxy-2-ethylhexanoic acid-cert-butyl ester, peroxy-3-methylpropionic acid-tert-butyl ester, peroxylauric acid-tert-butyl ester, tert-butylperoxy-3,5,5-trimethylhexanoate, tert-hexylperoxyisopropyl monocarbonate, tert-butylperoxyisopropyl carbonate, 2,5-dimethyl-2,5-bis(benzoylperoxy)hexane, peracetic acid-tert-butyl ester, perbenzoic acid-tert hexyl ester, and perbenzoic acid-tert-butyl ester. A reducing agent may be added to an organic peroxide, and the mixture may be used as a redox-based polymerization initiator.

Examples of the azo-based compounds may include 1,1-azobis(cyclohexane-1-carbonitrile), 2,2'-azobis(2-methylbutyronitrile), 2,2'-azobisbutyronitrile, 2,2'-azobis(2,4-dimethyl-valeronitrile), 2,2'-azobis(2,4-dimethyl-4-methoxyvaleronitrile), 2,2'-azobis(2-amidino-propane) hydrochloride, 2,2'-azobis[2-(5-methyl-2-imidazoline-2-yl)propane]hydrochloride, 2,2'-azobis[2-(2-imidazoline-2-yl)propane]hydrochloride, 2,2'-azobis[2-(5-methyl-2-imidazoline-2-yl)propane], 2,2'-azobis[2-methyl-N-(1,1-bis(2-hydroxymethyl)-2-hydroxyethyl)propionamide], 2,2'-azobis[2-methyl-N-(2-hydroxyethyl)propionamide], 2,2'-azobis(2-methyl-propionamide)dihydrate, 4,4'-azobis(4-cyano-valeric acid), 2,2'-azobis(2-hydroxymethylpropionitrile), 2,2'-azobis(2-methylpropionic acid)dimethyl ester (dimethyl 2,2'-azobis(2-methyl propionate)), and cyano-2-propylazoformamide.

If the amount used of the thermal-radical polymerization initiator is too small, curing failure occurs. If the amount used is too large, the life of a product decreases. Therefore, the amount used of the thermal-radical polymerization initiator is preferably 2 to 60 parts by mass and more preferably 5 to 40 parts by mass based on 100 parts by mass of the acrylate compound.

<Epoxy Compound>

The photopolymerizable insulating resin layer 10 constituting the first connection layer 1 may be formed from a thermal- or photo-cationic or anionic polymerizable resin layer containing an epoxy compound and a thermal- or photo-cationic or anionic polymerization initiator or from a layer obtained by subjecting the thermal- or photo-cationic or anionic polymerizable resin layer to thermal- or photo-radical polymerization.

When the photopolymerizable insulating resin layer 10 constituting the first connection layer 1 contains a thermal-cationic polymerizable resin containing an epoxy compound and a thermal cationic polymerization initiator, the epoxy compound is preferably a compound or resin having at least two epoxy groups in its molecule. These may be in liquid form or solid form. Specific examples thereof may include: glycidyl ethers obtained by reacting epichlorohydrin with polyphenols such as bisphenol A, bisphenol F, bisphenol S, hexahydrobisphenol A, tetramethylbisphenol A, diallylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl)methane, bixylenol, phenol novolac, and cresol novolac; polyglycidyl ethers obtained by reacting epichlorohydrin with aliphatic polyols such as glycerin, neopentyl glycol, ethylene glycol, propylene glycol, butylene glycol, hexylene glycol, polyethylene glycol, and polypropylene glycol; glycidyl ether esters obtained by reacting epichlorohydrin with hydroxycarboxylic acids such as p-oxybenzoic acid and β-oxynaphthoic acid, and polyglycidyl esters obtained from polycarboxylic acids such as phthalic acid, methylphthalic acid, isophthalic acid, terephthalic acid, tetrahydrophthalic acid, hexahydrophthalic acid, endomethylenetetrahydrophthalic acid, endomethylenehexahydrophthalic acid, trimellitic acid, and polymerized aliphatic acids; glycidyl amino glycidyl ethers obtained from aminophenol and aminoalkyl phenols; glycidyl amino glycidyl esters obtained from aminobenzoic acid; glycidyl amines obtained from aniline, toluidine, tribromoaniline, xylylenediamine, diaminocyclohexane, bisaminomethylcyclohexane, 4,4'-diaminodiphenylmethane, 4,4'-diaminodiphenylsulfone, etc.; and known epoxy resins such as epoxidized polyolefins. In addition, alicyclic epoxy compounds such as 3,4-epoxycyclohexenyl-methyl-3',4'-epoxycyclohexenecarboxylate can also be used.

<Thermal Cationic Polymerization Initiator>

The thermal cationic polymerization initiator used may be any known thermal cationic polymerization initiator for the epoxy compound. For example, a polymerization initiator that generates an acid capable of cationically polymerizing a cationic polymerizable compound by heat can be used, and known iodonium salts, sulfonium salts, phosphonium salts, ferrocenes, etc. can be used. Aromatic sulfonium salts exhibiting favorable latency with respect to temperature can be preferably used. Preferred examples of the thermal cationic polymerization initiator may include diphenyliodonium hexafluoroantimonate, diphenyliodonium hexafluorophosphate, diphenyliodonium hexafluoroborate, triphenylsulfonium hexafluoroantimonate, triphenylsulfonium hexafluorophosphate, and triphenylsulfonium hexafluoroborate. Specific examples of the thermal cationic polymerization initiator may include: SP-150, SP-170, CP-66, and CP-77 manufactured by ADEKA Corporation; CI-2855 and CI-2639 manufactured by Nippon Soda Co., Ltd.; San-Aid SI-60 and SI-80 manufactured by SANSHIN CHEMICAL INDUSTRY Co., Ltd.; and CYRACURE-UVI-6990 and UVI-6974 manufactured by Union Carbide Corporation.

If the amount added of the thermal cationic polymerization initiator is too small, thermal cationic polymerization tends not to proceed sufficiently. If the amount added is too large, it is feared that the thermal cationic polymerization initiator may cause a reduction in stiffness. Therefore, the amount of the thermal cationic polymerization initiator is preferably 0.1 to 25 parts by mass and more preferably 0.5 to 15 parts by mass based on 100 parts by mass of the epoxy compound.

<Thermal Anionic Polymerization Initiator>

The thermal anionic polymerization initiator used may be any known thermal anionic polymerization initiator for the epoxy compound. For example, a polymerization initiator that generates a base capable of anionically polymerizing an anionic polymerizable compound by heat can be used, and known aliphatic amine-based compounds, aromatic amine-based compounds, secondary amine-based compounds, tertiary amine-based compounds, imidazole-based compounds, polymercaptan-based compounds, boron trifluoride-amine complexes, dicyandiamide, organic acid hydrazides, etc. can be used. Encapsulated imidazole-based compounds exhibiting favorable latency with respect to temperature can be preferably used. Specific examples of the thermal anionic polymerization initiator include NOVACURE HX3941HP manufactured by Asahi Kasei E-materials Corporation.

If the amount added of the thermal anionic polymerization initiator is too small, curing failure tends to occur. If the amount added is too large, the life of a product tends to decrease. Therefore, the amount of the thermal anionic polymerization initiator is preferably 2 to 60 parts by mass and more preferably 5 to 40 parts by mass based on 100 parts by mass of the epoxy compound.

<Photo-cationic Polymerization Initiator and Photo-anionic Polymerization Initiator>

The photo-cationic polymerization initiator or photo-anionic polymerization initiator used for the epoxy compound may be any known appropriate polymerization initiator.

<Conductive Particles>

Conductive particles appropriately selected from those used for known anisotropic conductive films can be used as the conductive particles 4 constituting the first connection layer 1. Examples of such conductive particles may include particles of metals such as nickel, cobalt, silver, copper, gold, and palladium and metal-coated resin particles. Two or more types of particles may be used in combination.

If the average particle diameter of the conductive particles 4 is too small, the conductive particles 4 cannot support variations in height of traces, and conduction resistance tends to increase. If the average particle diameter is too large, the conductive particles 4 tend to cause a short circuit. Therefore the average particle diameter of the conductive particles 4 is preferably 1 to 10 µm and more preferably 2 to 6 µm. The average particle diameter can be measured using a general particle size distribution measuring device.

If the amount of the conductive particles 4 present in the first connection layer 1 is too small, the particle capturing efficiency decreases, so that it is difficult to achieve anisotropic conductive connection. If the amount is too large, it is feared that a short circuit may occur. Therefore, the amount of the conductive particles 4 is preferably 50 to 40,000 per square millimeter and more preferably 200 to 20,000 per square millimeter.

<Additional Components in First Connection Layer>

If necessary, a film-forming resin such as a phenoxy resin, an epoxy resin, an unsaturated polyester resin, a saturated polyester resin, a urethane resin, a butadiene resin, a polyimide resin, a polyamide resin, or a polyolefin resin may also be used for the first connection layer 1.

When the photopolymerizable insulating resin layer 10 constituting the first connection layer 1 is a layer obtained by photo-radical polymerization of a photo-radical polymerizable resin layer composed of an acrylate compound and a photo-radical polymerization initiator, it is preferable that the photopolymerizable insulating resin layer 10 further contain an epoxy compound and a thermal cationic polymerization initiator. In this case, it is preferable that also the second connection layer 2 and the third connection layer 3 each be a thermal-cationic polymerizable resin layer containing the epoxy compound and the thermal cationic polymerization initiator, as described later. In this manner, interlayer peel strength can be improved.

In the first connection layer 1, it is preferable that the conductive particles 4 dig into the third connection layer 3 (i.e., the conductive particles 4 be exposed at the surface of the first connection layer 1) as shown in FIG. 6. This is because, if the conductive particles are fully embedded in the first connection layer 1, it is feared that conduction reliability may deteriorate because of insufficient elimination of the insulating resin layer. If the degree of digging is too small, the particle capturing efficiency tends to become small. If the degree of digging is too large, the conduction resistance tends to become large. Therefore, the degree of digging is preferably 10 to 90% of the average particle diameter of the conductive particles and more preferably 20 to 80%.

<Second Connection Layer and Third Connection Layer>

Each of the second connection layer 2 and the third connection layer 3 is formed mainly of an insulating resin. The insulating resin used may be appropriately selected from known insulating resins. The second connection layer 2 and the third connection layer 3 may be formed from a material similar to that for the photopolymerizable insulating resin layer 10 in the first connection layer 1.

The second connection layer 2 is located on the first connection layer 1 on the side on which the conductive particles 4 are disposed and is generally a layer disposed on a terminal side for, for example, bumps of an IC chip on which high positional alignment accuracy is required. The third connection layer 3 is generally disposed on a terminal side for, for example, solid electrodes of a circuit board on which relatively high alignment accuracy is not required.

If the thickness of the second connection layer 2 is too small, it is feared that conduction failure may occur due to lack of the amount of resin for filling. If the thickness is too large, it is feared that the resin may be squeezed out during compression bonding, so that the compression bonding machine may become dirty. Therefore, the thickness of the second connection layer 2 is preferably 5 to 20 µm and more preferably 8 to 15 µm. If the thickness of the third connection layer 3 is too small, it is feared that application failure may occur when the film is temporarily applied to a second electronic component. If the thickness is too large, the value of the conduction resistance tends to become large. Therefore, the thickness of the third connection layer 3 is preferably 0.5 to 6 µm and more preferably 1 to 5 µm.

<<Applications of Anisotropic Conductive Film>>

The anisotropic conductive film obtained as described above can be preferably used when a first electronic component such as an IC chip or an IC module and a second electronic component such as a flexible substrate or a glass substrate are subjected to anisotropic conductive connection by heat or light. The connection structure obtained in the manner described above is also part of the present invention. In this case, it is preferable, in terms of improving connection reliability, to temporarily apply the anisotropic conductive film to the second electronic component such as a circuit board through the third connection layer of the anisotropic conductive film, then mount the first electronic component such as an IC chip on the temporarily applied anisotropic conductive film, and perform thermocompression bonding through the first electronic component. When light is used for connection, thermocompression bonding may also be used in combination.

EXAMPLES

The present invention will next be described more specifically by way of Examples.

Examples 1 to 6

A mixed solution containing, for example, an acrylate and a photo-radical polymerization initiator at one of compositions shown in TABLE 1 was prepared using ethyl acetate or toluene so that the amount of solids was adjusted to 50% by mass. The prepared mixed solution was applied to a 50 µm-thick release-treated polyethylene terephthalate film (PET release film) to a dry thickness of 5 µm and dried in an oven at 80° C. for 5 minutes to form a photo-radical polymerizable insulating resin layer serving as a first connection layer.

Next, a glass-made ultraviolet ray-transmitting transfer die in which cylindrical openings having a diameter of 5.5 µm and a depth of 4.5 µm were provided at longitudinal and lateral intervals of 9 µm was prepared. Then conductive particles with an average particle diameter of 4 µm (Ni/Au-plated resin particles, AUL704, SEKISUI CHEMICAL Co., Ltd.) were accommodated in the openings such that one conductive particle was placed in each opening. The insulating resin layer for the first connection layer was placed on the transfer die so as to face its opening-formed surface, and pressure was applied through the release film under the conditions of 60° C. and 0.5 MPa to press the conductive particles into the insulating resin layer. An insulating resin layer was thereby formed in which the thickness t1 of the photopolymerizable insulating resin layer in central regions between adjacent ones of the conductive particles (see FIG. 2B) was smaller than the thickness t2 of the photopolymerizable insulating resin layer in regions in proximity to the conductive particles (see FIG. 2B). TABLE 1 shows the results of electron microscope measurement of the thickness t1 of the photopolymerizable insulating resin layer in the central regions between adjacent ones of the conductive particles and the thickness t2 of the photopolymerizable insulating resin layer in the regions in proximity to the conductive particles. The result of computation of the ratio of t1 to t2 [t1/t2] is also shown.

Next, the photo-radical polymerizable insulating resin layer was irradiated with ultraviolet rays having a wavelength of 365 nm at an integrated light quantity of 4,000 mL/cm² through the ultraviolet ray-transmitting transfer die to thereby form a first connection layer with the conductive particles secured on its surface.

Next, the PET release film adhering to the first connection layer was peeled off to expose the first connection layer.

Next, a mixed solution containing, for example, a thermosetting resin and a latent curing agent was prepared using ethyl acetate or toluene so that the amount of solids was adjusted to 50% by mass. The prepared mixed solution was applied to a 50 μm-thick PET release film to a dry thickness of 12 μm and dried in an oven at 80° C. for 5 minutes to form a second connection layer. A third connection layer having a dry thickness of 3 μm was formed using a similar procedure.

The second connection layer formed on the PET release film was laminated onto the exposed surface of the above-obtained first connection layer under the conditions of 60° C. and 0.5 MPa, and then the laminate was removed from the transfer die. Similarly, the third connection layer was laminated onto the conductive particle-protruding surface of the first connection layer in the removed laminate to thereby obtain an anisotropic conductive film.

Comparative Example 1

A photo-radical polymerizable insulating resin layer used as a precursor layer of the first connection layer was formed in the same manner as in Example 1.

Next, a glass-made ultraviolet ray-transmitting transfer die in which cylindrical openings having a diameter of 5.5 μm and a depth of 4.5 μm were provided at longitudinal and lateral intervals of 9 μm was prepared. Then conductive particles with an average particle diameter of 4 μm (Ni/Au-plated resin particles, AUL704, SEKISUI CHEMICAL Co., Ltd.) were accommodated in the openings such that one conductive particle was placed in each opening. The insulating resin layer for the first connection layer was placed on the transfer die so as to face its opening-formed surface, and pressure was applied through the release film under relatively weak conditions, i.e., 40° C. and 0.1 MPa, to transfer the conductive particles onto the insulating resin layer. The film with the conductive particles transferred thereonto was removed, and then the conductive particles were fully pressed into the insulating resin layer such that the surface of the resin layer became flat.

Next, the photo-radical polymerizable insulating resin layer with the conductive particles embedded therein was irradiated with ultraviolet rays having a wavelength of 365 nm at an integrated light quantity of 4,000 mL/cm² to thereby form a flat first connection layer.

Next, the PET release film adhering to the first connection layer was peeled off to expose the first connection layer.

A 3 μm-thick third connection layer and a 12 μm-thick second connection layer produced in the same manner as in Example 1 were laminated onto the first connection layer to obtain an anisotropic conductive film.

Comparative Example 2

A mixture prepared by dispersing the same conductive particles as those used in Example 1 in a resin composition for a first connection layer shown in TABLE 1 was used to produce a 6 μm-thick resin film containing the conductive particles. The amount of the conductive particles present in the conductive particle-containing resin film was 20,000 per square millimeter. A 12 μm-thick second connection layer produced in the same manner as in Example 1 was laminated on the above film under the conditions of 60° C. and 0.5 MPa to produce an anisotropic conductive film having a two-layer structure.

<Evaluation>

As for the uniform planar arrangement of the conductive particles in each of the anisotropic conductive films obtained, when the uniform planar arrangement was formed in the anisotropic conductive film, "YES" was assigned to "application of uniform planar arrangement of conductive particles" for the anisotropic conductive film. Otherwise, "NO" was assigned. As for the thickness of the insulating resin layer in the regions in proximity to the conductive particles, when this thickness was larger than the thickness of the insulating resin layer in the central regions between the conductive particles (including a thickness of 0), "YES" was assigned to "increase in thickness of insulating resin layer in regions in proximity to conductive particles." Otherwise, "NO" was assigned. The results are shown in TABLE 1. The number of layers forming each anisotropic conductive film is also shown.

Figure 7:
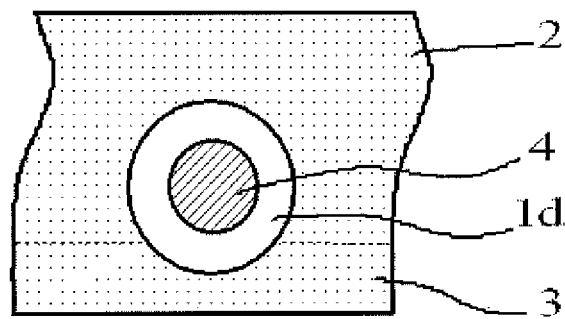
FIG. 7 is a partial cross-sectional view of the anisotropic conductive film obtained by the production method of the present invention.

Each of the obtained anisotropic conductive films was used to mount an IC chip with dimensions of 0.5×1.8×20.0 mm (bump size: 30×85 μm, bump height: 15 μm, bump pitch: 50 μm) on a glass circuit board (1737F) with dimensions of 0.5×50×30 mm manufactured by Corning Incorporated under the conditions of 180° C., 80 MPa, and 5 seconds to thereby obtain a sample connection structure. A cross section of the connection portion of the sample connection structure was observed under an electron microscope, and it was found that an insulating resin layer as shown in FIG. 7 was present around some of the conductive particles.

For each obtained sample connection structure, "minimum melt viscosity," "particle capturing efficiency," "conduction reliability," and "insulating properties" were tested and evaluated in the manners described below. The results obtained are shown in TABLE 1.

"Minimum Melt Viscosity"

The minimum melt viscosity of each of the first connection layer and second connection layer constituting the sample connection structure was measured using a rotary rheometer (TA Instruments) under the conditions of a temperature rise rate of 10° C./min, a constant measurement pressure of 5 g, and a diameter of the measurement plate used of 8 mm.

"Particle Capturing Efficiency"

The ratio of "the amount of particles actually captured on the bumps in the sample connection structure after heating and pressurization (actual mounting)" to "the theoretical amount of particles present on the bumps in the sample connection structure before heating and pressurization" was determined using the following formula. Practically, the ratio is preferably 40% or more.

Particle capturing efficiency (%)={[number of particles on bumps after heating and pressurization]/[number of particles on bumps before heating and pressurization]}×100

"Conduction Reliability"

The sample connection structure was left to stand in a high-temperature high-humidity environment of 85° C. and 85% RH, and the initial conduction resistance value and the conduction resistance value after 500 hours were measured. It is practically preferable that the resistance value be 10Ω or less even after 500 hours.

"Insulating Properties"

The rate of occurrence of a short circuit in a comb-shaped TEG pattern with a spacing of 7.5 μm was determined. Practically, the rate is preferably 100 ppm or less.

TABLE 1

| | | | | | Example | | | |
|---|---|---|---|---|---|---|---|---|
| | | | | | 1 | 2 | 3 | 4 |
| | Application of Uniform Planar Arrangement of Conductive Particles | | | | Yes | Yes | Yes | Yes |
| | Increase in Thickness of Insulating Resin Layer in Regions in proximity to Conductive Particles | | | | Yes | Yes | Yes | Yes |
| | Thickness of Insulating Resin Layer in Central Regions between Adjacent Particles: t1 [μm] | | | | 3 | 3 | 3 | 3 |
| | Thickness of Insulating Resin Layer in Regions in proximity to Conductive Particles: t2 [μm] | | | | 6 | 6 | 6 | 6 |
| | Thickness Ratio of insulating Resin Layer in First Connection Layer [t1/t2] | | | | 0.5 | 0.5 | 0.5 | 0.5 |
| | Number of Layers Consulting Anisotropic Condictive Film | | | | 3 | 3 | 3 | 3 |
| First Connection Layer | Phenoxy Resin (Parts By Mass) | YP-50 | Nippon Steel Sumikin Chemical Co., Ltd. | | 60 | 60 | 60 | 60 |
| | Acrylate (Parts By Mass) | EB600 | Daicel-Alinex, Ltd. | | 40 | 40 | | |
| | Photo-Radical Polymerization Initiator (Parts By Mass) | IRGACURE 369 | BASF Japan Ltd. | | 2 | 2 | | |
| | Epoxy Resin (Parts By Mass) | jER828 | Mitsubishi Chemical Corporation | | | | 40 | 40 |
| | Thermal Cationic Polymerization Initiator (Parts By Mass) | SI-60L | Sanshin Chemical Industry Co., Ltd. | | | | 2 | 2 |
| | Minimum Melt Viscosity of First Connection Layer | | [mPa · s] After UV Irradiation for Examples 1 and 2 | | 20000 | 20000 | 20000 | 20000 |
| Second Connection Layer | Phenoxy Resin (Parts By Mass) | YP-50 | Nippon Steel Sumikin Chemical Co., Ltd. | | 60 | 60 | 60 | 60 |
| | Epoxy Resin (Parts By Mass) | jER828 | Mitsubishi Chemical Corporation | | 40 | | 40 | |
| | Thermal Cationic Polymerization Initiator (Parts By Mass) | SI-60L | Sanshin Chemical Industry Co., Ltd. | | 2 | | 2 | |
| | Acrylate (Parts By Mass) | EB600 | Daicel-Alinex, Ltd. | | | 40 | | |
| | Organic Peroxide (Parts By Mass) | PerhexylZ | NCF Corporation | | | 2 | | |
| | Minimum Melt Viscosity of Second Connection Layer | | [mPa · s] | | 500 | 500 | 500 | 500 |
| Third Connection Layer | Phenoxy Resin (Parts By Mass) | YP-50 | Nippon Steel Sumikin Chemical Co., Ltd. | | 60 | 60 | 60 | 60 |
| | Epoxy Resin (Parts By Mass) | jER828 | Mitsubishi Chemical Corporation | | 40 | | 40 | |
| | Thermal Cationic Polymerization Initiator (Parts By Mass) | SI-60L | Sanshin Chemical Industry Co., Ltd. | | 2 | | 2 | |
| | Acrylate (Parts By Mass) | EB600 | Daicel-Alinex, Ltd. | | | 40 | | 40 |
| | Organic Peroxide (Parts By Mass) | PerhexylZ | NCF Corporation | | | 2 | | 2 |
| | Minimum Melt Viscosity of Third Connection Layer | | [mPa · s] | | 500 | 500 | 500 | 500 |
| | [Minimum Melt Viscosity of First Connection Layer]/[Minimum Melt Viscosity of Second or Third Connection Layer] | | | | 40 | 40 | 40 | 40 |
| | Conduction Resistance Value (Ω) | | Initial | | 0.2 | 0.2 | 0.2 | 0.2 |
| | | | 85° C., 85% RH, 500 hr | | 5.0 | 6.0 | 8.0 | 7.0 |
| | Insulating Properties(Rate of Occurrence of Short Circuit) | | [ppm] | | 30 | 30 | 30 | 30 |
| | Particle Capturing Efficiency | | [%] | | 82.4 | 79.2 | 80.4 | 83.1 |

| | | | | Example | | Comparative Example | |
|---|---|---|---|---|---|---|---|
| | | | | 5 | 6 | 1 | 2 |
| | Application of Uniform Planar Arrangement of Conductive Particles | | | Yes | Yes | Yes | No |
| | Increase in Thickness of Insulating Resin Layer in Regions in proximity to Conductive Particles | | | Yes | Yes | No | No |
| | Thickness of Insulating Resin Layer in Central Regions between Adjacent Particles: t1 [μm] | | | 3 | 3 | — | — |
| | Thickness of Insulating Resin Layer in Regions in proximity to Conductive Particles: t2 [μm] | | | 6 | 6 | — | — |
| | Thickness Ratio of insulating Resin Layer in First Connection Layer [t1/t2] | | | 0.5 | 0.5 | — | — |
| | Number of Layers Consulting Anisotropic Condictive Film | | | 3 | 3 | 3 | 3 |
| First Connection Layer | Phenoxy Resin (Parts By Mass) | YP-50 | Nippon Steel Sumikin Chemical Co., Ltd. | 80 | 40 | 60 | 60 |
| | Acrylate (Parts By Mass) | EB600 | Daicel-Alinex, Ltd. | 20 | 60 | 40 | 40 |
| | Photo-Radical Polymerization Initiator (Parts By Mass) | IRGACURE 369 | BASF Japan Ltd. | 2 | 2 | 2 | 2 |
| | Epoxy Resin (Parts By Mass) | jER828 | Mitsubishi Chemical Corporation | | | | |
| | Thermal Cationic Polymerization Initiator (Parts By Mass) | SI-60L | Sanshin Chemical Industry Co., Ltd. | | | | |
| | Minimum Melt Viscosity of First Connection Layer | | [mPa · s] After UV Irradiation for Examples 1 and 2 | 2000 | 100000 | 20000 | 20000 |

TABLE 1-continued

| | | | | | | | |
|---|---|---|---|---|---|---|---|
| Second Connection Layer | Phenoxy Resin (Parts By Mass) | YP-50 | Nippon Steel Sumikin Chemical Co., Ltd. | 60 | 80 | 60 | 60 |
| | Epoxy Resin (Parts By Mass) | jER828 | Mitsubishi Chemical Corporation | 40 | 20 | 40 | 40 |
| | Thermal Cationic Polymerization Initiator (Parts By Mass) | SI-60L | Sanshin Chemical Industry Co., Ltd. | 2 | 2 | 2 | 2 |
| | Acrylate (Parts By Mass) | EB600 | Daicel-Alinex, Ltd. | 40 | | | |
| | Organic Peroxide (Parts By Mass) | PerhexylZ | NCF Corporation | 2 | | | |
| Minimum Melt Viscosity of Second Connection Layer | | | [mPa · s] | 500 | 250 | 500 | 500 |
| Third Connection Layer | Phenoxy Resin (Parts By Mass) | YP-50 | Nippon Steel Sumikin Chemical Co., Ltd. | 60 | 60 | 60 | |
| | Epoxy Resin (Parts By Mass) | jER828 | Mitsubishi Chemical Corporation | 40 | 40 | 40 | |
| | Thermal Cationic Polymerization Initiator (Parts By Mass) | SI-60L | Sanshin Chemical Industry Co., Ltd. | 2 | 2 | 2 | |
| | Acrylate (Parts By Mass) | EB600 | Daicel-Alinex, Ltd. | | | | |
| | Organic Peroxide (Parts By Mass) | PerhexylZ | NCF Corporation | | | | |
| Minimum Melt Viscosity of Third Connection Layer | | | [mPa · s] | 500 | 250 | 500 | — |
| [Minimum Melt Viscosity of First Connection Layer]/[Minimum Melt Viscosity of Second or Third Connection Layer] | | | | 4 | 400 | 40 | 40 |
| Conduction Resistance Value (Ω) | | | Initial | 0.2 | 0.2 | 2.0 | 0.2 |
| | | | 85° C., 85% RH, 500 hr | 5.0 | 8.0 | 50.0 | 5.0 |
| Insulating Properties(Rate of Occurrence of Short Circuit) | | | [ppm] | 100 | 10 | 30 | 3000 |
| Particle Capturing Efficiency | | | [%] | 43.6 | 85.0 | 63.7 | 25.0 |

As can be seen from TABLE 1, for the anisotropic conductive films in Examples 1 to 6, the results for the evaluation of the particle capturing efficiency, conduction reliability, and insulating properties were practically preferable. As can be seen from the results for Examples 1 to 4, when the curing systems of the first, second, and third connection layers are the same, these layers are reacted with each other. In this case, the ease of pushing the conductive particles is slightly reduced, and the conduction resistance value tends to increase. When the first connection layer is a cationic polymerization system, heat resistance is more improved than that in a radical polymerization system. Also in this case, the ease of pushing the conductive particles is slightly reduced, and the conduction resistance value tends to increase.

However, in the anisotropic conductive film of Comparative Example 1, the thickness of the insulating resin layer in central regions between adjacent ones of the conductive particles in the first connection layer was not smaller than the thickness of the insulating resin layer in regions in proximity to the conductive particles, so that the conduction resistance performance was reduced significantly. In the anisotropic conductive film in Comparative Example 2 having a conventional two-layer structure, the particle capturing efficiency was reduced significantly, and the insulating properties were problematic.

Examples 7 to 8

Anisotropic conductive films were produced in the same manner as in Example 1 except that the conditions for pressurization through the release film when the first connection layer was formed as shown in TABLE 2 were controlled so that the ratio of the thickness t1 of the photopolymerizable insulating resin layer in the central regions between adjacent ones of the conductive particles (see FIG. 2B) to the thickness t2 of the photopolymerizable insulating resin layer in the regions in proximity to the conductive particles (see FIG. 2B) [t1/t2] was one of the ratios in TABLE 2.

<Evaluation>

For each of the obtained anisotropic conductive films, the uniform planar arrangement of the conductive particles was evaluated in the same manner as in Example 1. The results obtained are shown in TABLE 2. The number of layers constituting each anisotropic conductive film is also shown.

The obtained anisotropic conductive films were used to obtain sample connection structures in the same manner as in Example 1. A cross section of the connection portion of each sample connection structure was observed under an electron microscope, and it was found that an insulating resin layer as shown in FIG. 7 was present around some of the conductive particles.

For each obtained sample connection structure, "minimum melt viscosity," "particle capturing efficiency," and "insulating properties" were tested and evaluated in the same manners as in Example 1, as described below. The "conduction reliability" was tested and evaluated in the following manner. The results obtained are shown in TABLE 2.

"Conduction Reliability"

The sample connection structure was left to stand in a high-temperature high-humidity environment of 85° C. and 85% RH. The sample connection structure was removed at every 100 hour interval to check an increase in conduction resistance. The time at which the conduction resistance exceeded 50Ω was used as the time to failure. Practically, the time to failure is preferably 1,000 hours or longer.

TABLE 2

| | Example | |
|---|---|---|
| | 7 | 8 |
| Application of Uniform Planar Arrangement of Conductive Particles | Yes | Yes |
| Thickness of Insulating Resin Layer in Central Regions between Adjacent Particles: t1 [μm] | 1.5 | 4 |
| Thickness of Insulating Resin Layer in Regions in proximity to Conductive Particles: t2 [μm] | 7.5 | 5 |

TABLE 2-continued

|  |  |  |  | Example | |
|---|---|---|---|---|---|
|  |  |  |  | 7 | 8 |
| Thickness Ratio of Insulating Resin Layer in First Connection Layer [t1/t2] | | | | 0.2 | 0.8 |
| Number of Layers Constituting Anisotropic Conductive Film | | | | 3 | 3 |
| First Connection Layer | Phenoxy Resin (Parts By Mass) | YP-50 | Nippon Steel Sumikin Chemical Co., Ltd, | 60 | 60 |
| | Acrylate (Parts By Mass) | EB600 | Daicel-Allnex, Ltd. | 40 | 40 |
| | Photo-Radical Polymerization Initiator (Parts By Mass) | IRGACURE 369 | BASF Japan Ltd. | 2 | 2 |
| Minimum Melt Viscosity of First Connection Layer | | [mPa · s] | | 20000 | 20000 |
| Second Connection Layer | Phenoxy Resin (Parts By Mass) | YP-50 | Nippon Steel Sumikin Chemical Co., Ltd. | 60 | 60 |
| | Epoxy Resin (Parts By Mass) | jER.828 | Mitsubishi Chemical Corporation | 40 | 40 |
| | Thermal Cationic Polymerization Initiator (Parts By Mass) | SI-60L | Sanshin Chemical Industry Co., Ltd. | 2 | 2 |
| Minimum Melt Viscosity of Second Connection Layer | | [mPa · s] | | 500 | 500 |
| Third Connection Layer | Phenoxy Resin (Parts By Mass) | YP-50 | Nippon Steel Sumikin Chemical Co., Ltd. | 60 | 60 |
| | Epoxy Resin (Parts By Mass) | jER828 | Mitsubishi Chemical Corporation | 40 | 40 |
| | Thermal Cationic Polymerization Initiator (Parts By Mass) | SI-60L | Sanshin Chemical Industry Co., Ltd. | 2 | 2 |
| Minimum Melt Viscosity of Third Connection Layer | | [mPa · s] | | 500 | 500 |
| [Minimum Melt Viscosity of First Connection Layer]/[Minimum Melt Viscosity of Second or Third Connection Layer] | | | | 40 | 40 |
| Conduction Reliability | | [hr] | | ≥1000 | ≥1000 |
| Insulating Properties (Rate of Occurrence of Short Circuit) | | [ppm] | | 5 | 50 |
| Particle Capturing Efficiency | | [%] | | 90 | 70 |

As can be seen from the results in TABLE 2, when the ratio of the thickness t1 of the photopolymerizable insulating resin layer in the central regions between adjacent ones of the conductive particles to the thickness t2 of the photopolymerizable insulating resin layer in the regions in proximity to the conductive particles (see FIG. 2B) [t1/t2] was 0.2 to 0.8, favorable results were obtained for each of the conduction reliability, the insulating properties, and the particle capturing efficiency. It was found that as the value of [t1/t2] decreases, the insulating properties, in particular, tends to be improved.

Examples 9 to 20

Anisotropic conductive films were produced in the same manner as in Example 1 except that the conditions for pressurization through the release film when the first connection layer was formed as shown in TABLE 3 were controlled so that the ratio of the thickness t1 of the photopolymerizable insulating resin layer in the central regions between adjacent ones of the conductive particles (see FIG. 2B) to the thickness t2 of the photopolymerizable insulating resin layer in the regions in proximity to the conductive particles (see FIG. 2B) [t1/t2] was one of the ratios in TABLE 3. Specifically, the surface of the first connection layer was wiped as needed using known wiping means such as a squeegee after the formation of the first connection layer.

<Evaluation>

As for the uniform planar arrangement of the conductive particles in each of the anisotropic conductive films obtained, when the uniform planar arrangement was formed in the anisotropic conductive film, "YES" was assigned to "application of uniform planar arrangement of conductive particles" for the anisotropic conductive film. Otherwise, "NO" was assigned. As for the thickness of the insulating resin layer in the regions in proximity to the conductive particles, when this thickness was larger than the thickness of the insulating resin layer in the central regions between the conductive particles (including a thickness of 0), "YES" was assigned to "increase in thickness of insulating resin layer in regions in proximity to conductive particles." Otherwise, "NO" was assigned. The results are shown in TABLE 1 or 2. The number of layers constituting each anisotropic conductive film is also shown.

For Examples 9 to 20, the ratio of the number of conductive particles present in the third connection layer to the total number of conductive particles in an area of 200 μm×200 μm was measured using an optical microscope. The results obtained are shown in TABLE 3. The influence of the ratio of conductive particles present in the third connection layer was examined. When the value of the ratio is 0, conductive particles are present only in the first connection layer. When the value of the ratio is 1, conductive particles are present only in the third connection layer 3.

The obtained anisotropic conductive films were used to obtain sample connection structures in the same manner as in Example 1. A cross section of the connection portion of each sample connection structure was observed under an electron microscope, and it was found that an insulating resin layer as shown in FIG. 7 was present around some of the conductive particles.

For each obtained anisotropic conductive film, "minimum melt viscosity," "particle capturing efficiency," and "insulating properties" were tested and evaluated in the same manners as in Example 1, as described below. The "conduction reliability" was tested and evaluated in the following manner. The results obtained are shown in TABLE 3.

"Conduction Reliability"

The sample connection structure was left to stand in a high-temperature high-humidity environment of 85° C. and 85% RH. The sample connection structure was removed at every 100 hour interval to check an increase in conduction resistance. The time at which the conduction resistance exceeded 50Ω was used as the time to failure. Practically, the time to failure is preferably 1,000 hours or longer.

TABLE 3

| | | | | Example | | | | |
|---|---|---|---|---|---|---|---|---|
| | | | | 9 | 10 | 11 | 12 | 13 |
| | Application of Uniform Planar Arrangement of Conductive Particles | | | Yes | Yes | Yes | Yes | Yes |
| | Thickness of Insulating Resin Layer in Central Regions between Adjacent Particles: $t_1$ [μm] | | | 0 | 1.5 | 3 | 4 | 0 |
| | Thickness of Insulating Resin Layer in Regions in proximity to Conductive Particles: $t_2$ [μm] | | | 9 | 7.5 | 6 | 5 | 9 |
| | Thickness Ratio of Insulating Resin Layer in First Connection Layer [$t_1/t_2$] | | | 0 | 0.2 | 0.5 | 0.8 | 0 |
| | Number Ratio of Particles Present in Third Connection Layer | | | 0.5 | 0.1 | 0.2 | 0.3 | 0.55 |
| | Number of Layers Consulting Anisotropic Conductive Film | | | 3 | 3 | 3 | 3 | 3 |
| First Connection Layer | Phenoxy Resin (Parts By Mass) | YP-50 | Nippon Steel Sumikin Chemical Co., Ltd. | 60 | 60 | 60 | 60 | 60 |
| | Acrylate (Parts By Mass) | EB600 | Daicel-Alinex, Ltd. | 40 | 40 | 40 | 40 | 40 |
| | Photo-Radical Polymerization Initiator (Parts By Mass) | IRGACURE 369 | BASF Japan Ltd. | 2 | 2 | 2 | 2 | 2 |
| | Minimum Melt Viscosity of First Connection Layer | | [mPa · s] | 20000 | 20000 | 20000 | 20000 | 20000 |
| Second Connection Layer | Phenoxy Resin (Parts By Mass) | YP-50 | Nippon Steel Sumikin Chemical Co., Ltd. | 60 | 60 | 60 | 60 | 60 |
| | Epoxy Resin (Parts By Mass) | jER828 | Mitsubishi Chemical Corporation | 40 | 40 | 40 | 40 | 40 |
| | Thermal Cationic Polymerization Initiator (Parts By Mass) | SI-60L | Sanshin Chemical Industry Co., Ltd. | 2 | 2 | 2 | 2 | 2 |
| | Minimum Melt Viscisity of Second Connection Layer | | [mPa · s] | 500 | 500 | 500 | 500 | 500 |
| Third Connection Layer | Phenoxy Resin (Parts By Mass) | YP-50 | Nippon Steel Sumikin Chemical Co., Ltd. | 60 | 60 | 60 | 60 | 60 |
| | Epoxy Resin (Parts By Mass) | jER828 | Mitsubishi Chemical Corporation | 40 | 40 | 40 | 40 | 40 |
| | Thermal Cationic Polymerization Initiator (Parts By Mass) | SI-60L | Sanshin Chemical Industry Co., Ltd. | 2 | 2 | 2 | 2 | 2 |
| | Minimum Melt Viscosity of Third Connection Layer | | [mPa · s] | 500 | 500 | 500 | 500 | 500 |
| | [Minimum Melt Viscosity of First Connection Layer]/[Minimum Melt Viscosity of Second or Third Connection Layer] | | | 40 | 40 | 40 | 40 | 40 |
| Conduction Reliability | | | [hr] | ≥1000 | ≥1000 | ≥1000 | ≥1000 | ≥1000 |
| Insulating Properties (Rate of Occurrence of Short Circuit) | | | [ppm] | 60 | 5 | 30 | 50 | 75 |
| Particle Capturing Efficiency | | | [%] | 70 | 90 | 82.4 | 70 | 70 |

| | | | | Example | | | |
|---|---|---|---|---|---|---|---|
| | | | | 14 | 15 | 16 | 17 |
| | Application of Uniform Planar Arrangement of Conductive Particles | | | Yes | Yes | Yes | Yes |
| | Thickness of Insulating Resin Layer in Central Regions between Adjacent Particles: $t_1$ [μm] | | | 1.5 | 3 | 4 | 0 |
| | Thickness of Insulating Resin Layer in Regions in proximity to Conductive Particles: $t_2$ [μm] | | | 7.5 | 6 | 5 | 9 |
| | Thickness Ratio of Insulating Resin Layer in First Connection Layer [$t_1/t_2$] | | | 0.2 | 0.5 | 0.8 | 0 |
| | Number Ratio of Particles Present in Third Connection Layer | | | 0.5 | 0.45 | 0.4 | 0.05 |
| | Number of Layers Consulting Anisotropic Conductive Film | | | 3 | 3 | 3 | 3 |
| First Connection Layer | Phenoxy Resin (Parts By Mass) | YP-50 | Nippon Steel Sumikin Chemical Co., Ltd. | 60 | 60 | 60 | 60 |
| | Acrylate (Parts By Mass) | EB600 | Daicel-Alinex, Ltd. | 40 | 40 | 40 | 40 |
| | Photo-Radical Polymerization Initiator (Parts By Mass) | IRGACURE 369 | BASF Japan Ltd. | 2 | 2 | 2 | 2 |
| | Minimum Melt Viscosity of First Connection Layer | | [mPa · s] | 20000 | 20000 | 20000 | 20000 |
| Second Connection Layer | Phenoxy Resin (Parts By Mass) | YP-50 | Nippon Steel Sumikin Chemical Co., Ltd. | 60 | 60 | 60 | 60 |
| | Epoxy Resin (Parts By Mass) | jER828 | Mitsubishi Chemical Corporation | 40 | 40 | 40 | 40 |
| | Thermal Cationic Polymerization Initiator (Parts By Mass) | SI-60L | Sanshin Chemical Industry Co., Ltd. | 2 | 2 | 2 | 2 |
| | Minimum Melt Viscisity of Second Connection Layer | | [mPa · s] | 500 | 500 | 500 | 500 |
| Third Connection Layer | Phenoxy Resin (Parts By Mass) | YP-50 | Nippon Steel Sumikin Chemical Co., Ltd. | 60 | 60 | 60 | 60 |
| | Epoxy Resin (Parts By Mass) | jER828 | Mitsubishi Chemical Corporation | 40 | 40 | 40 | 40 |
| | Thermal Cationic Polymerization Initiator (Parts By Mass) | SI-60L | Sanshin Chemical Industry Co., Ltd. | 2 | 2 | 2 | 2 |
| | Minimum Melt Viscosity of Third Connection Layer | | [mPa · s] | 500 | 500 | 500 | 500 |
| | [Minimum Melt Viscosity of First Connection Layer]/[Minimum Melt Viscosity of Second or Third Connection Layer] | | | 40 | 40 | 40 | 40 |
| Conduction Reliability | | | [hr] | ≥1000 | ≥1000 | ≥1000 | ≥1000 |
| Insulating Properties (Rate of Occurrence of Short Circuit) | | | [ppm] | 60 | 55 | 50 | 5 |
| Particle Capturing Efficiency | | | [%] | 72 | 67 | 65 | 85 |

TABLE 3-continued

|  |  |  |  | Example | | |
|---|---|---|---|---|---|---|
|  |  |  |  | 18 | 19 | 20 |
|  | Application of Uniform Planar Arrangement of Conductive Particles | | | Yes | Yes | Yes |
|  | Thickness of Insulating Resin Layer in Central Regions between Adjacent Particles: t1 [μm] | | | 1.5 | 3 | 4 |
|  | Thickness of Insulating Resin Layer in Regions in proximity to Conductive Particles: t2 [μm] | | | 7.5 | 6 | 5 |
|  | Thickness Ratio of Insulating Resin Layer in First Connection Layer [t1/t2] | | | 0.2 | 0.5 | 0.8 |
|  | Number Ratio of Particles Present in Third Connection Layer | | | 0.03 | 0.01 | ≥0.01 |
|  | Number of Layers Consulting Anisotropic Condictive Film | | | 3 | 3 | 3 |
| First Connection Layer | Phenoxy Resin (Parts By Mass) | YP-50 | Nippon Steel Sumikin Chemical Co., Ltd. | 60 | 60 | 60 |
|  | Acrylate (Parts By Mass) | EB600 | Daicel-Alinex, Ltd. | 40 | 40 | 40 |
|  | Photo-Radical Polymerization Initiator (Parts By Mass) | IRGACURE 369 | BASF Japan Ltd. | 2 | 2 | 2 |
|  | Minimum Melt Viscosity of First Connection Layer |  | [mPa · s] | 20000 | 20000 | 20000 |
| Second Connection Layer | Phenoxy Resin (Parts By Mass) | YP-50 | Nippon Steel Sumikin Chemical Co., Ltd. | 60 | 60 | 60 |
|  | Epoxy Resin (Parts By Mass) | jER828 | Mitsubishi Chemical Corporation | 40 | 40 | 40 |
|  | Thermal Cationic Polymerization Initiator (Parts By Mass) | SI-60L | Sanshin Chemical Industry Co., Ltd. | 2 | 2 | 2 |
|  | Minimum Melt Viscisity of Second Connection Layer |  | [mPa · s] | 500 | 500 | 500 |
| Third Connection Layer | Phenoxy Resin (Parts By Mass) | YP-50 | Nippon Steel Sumikin Chemical Co., Ltd. | 60 | 60 | 60 |
|  | Epoxy Resin (Parts By Mass) | jER828 Corporation | Mitsubishi Chemical | 40 | 40 | 40 |
|  | Thermal Cationic Polymerization Initiator (Parts By Mass) | SI-60L | Sanshin Chemical Industry Co., Ltd. | 2 | 2 | 2 |
|  | Minimum Melt Viscosity of Third Connection Layer |  | [mPa · s] | 500 | 500 | 500 |
|  | [Minimum Melt Viscosity of First Connection Layer]/[Minimum Melt Viscosity of Second or Third Connection Layer] | | | 40 | 40 | 40 |
|  | Conduction Reliability | | [hr] | ≥1000 | ≥1000 | ≥1000 |
|  | Insulating Properties (Rate of Occurrence of Short Circuit) | | [ppm] | 10 | 3 | 5 |
|  | Particle Capturing Efficiency | | [%] | 83 | 85 | 90 |

As can be seen from the results in TABLE 3, when the ratio of the thickness t1 of the photopolymerizable insulating resin layer in the central regions between adjacent ones of the conductive particles to the thickness t2 of the photopolymerizable insulating resin layer in the regions in proximity to the conductive particles (see FIG. 2B) [t1/t2] was 0.2 to 0.8, favorable results were obtained for each of the conduction reliability, the insulating properties, and the particle capturing efficiency. It was found that as the value of [t1/t2] decreases, the insulating properties, in particular, tends to be improved.

Even when the thickness t1 of the photopolymerizable insulating resin layer was 0 (Examples 9, 13, and 17), favorable results were obtained for each of the conduction reliability, the insulating properties, and the particle capturing efficiency when the thickness t2 of the photopolymerizable insulating resin layer was set to be relatively large, i.e., preferably larger than the diameter of the conductive particles and less than three times the diameter of the conductive particles and more preferably 1.25 to 2.2 times. It was found that, when the thickness t2 of the photopolymerizable insulating resin layer is increased, the ratio of the number of conductive particles present in the third connection layer to the total number of conductive particles tends to increase. It was found that, even when more than half of the conductive particles are present in the third connection layer, no problem occurs in the performance of the anisotropic conductive film.

INDUSTRIAL APPLICABILITY

In the anisotropic conductive film of the present invention having a three-layer structure in which the first connection layer is held between the insulating second connection layer and the insulating third connection layer, the first connection layer has a structure in which the conductive particles are arranged in a single layer in a plane direction of the insulating resin layer on its side facing the third connection layer. In this structure, the thickness of the insulating resin layer in the central regions between adjacent ones of the conductive particles is smaller than the thickness of the insulating resin layer in the regions in proximity to the conductive particles. Therefore, with the anisotropic conductive film in which the conductive particles are arranged in a single layer, favorable connection reliability, favorable insulating properties, and favorable particle capturing efficiency can be achieved. The anisotropic conductive film is useful for anisotropic conductive connection of an electronic component such as an IC chip to a circuit board.

REFERENCE SIGNS LIST 1 first connection layer
1X region having a low degree of cure in first connection layer
1Y region having a high degree of cure in first connection layer
2 second connection layer
3 third connection layer
4 conductive particle
10 photopolymerizable insulating resin layer
20 light-transmitting transfer die
21 opening
22 release film
100 anisotropic conductive film

The invention claimed is:

1. An anisotropic conductive film comprising:
   a first connection layer formed mainly of insulating resin, the first connection layer having a structure in which conductive particles are embedded in the first connection layer and present in a single layer without being in contact with each other, and insulating resin in vicinity of the conductive particles has undulation on a first side of the first connection layer, wherein in the first connection layer, a ratio of a thickness t1 of the insulating resin in central regions between adjacent conductive particles to a thickness t2 of the insulating resin in regions in proximity to the conductive particles is in a range of from 0.2 to 0.5; and
   a second connection layer formed mainly of insulating resin, the second connection layer being laminated on a second side of the first connection layer that is opposite the first side.

2. The anisotropic conductive film according to claim 1, wherein the conductive particles are arranged.

3. The anisotropic conductive film according to claim 1, wherein the conductive particles protrude from the first connection layer.

4. The anisotropic conductive film according to claim 1, wherein the conductive particles are exposed on a surface of the first side of the first connection layer.

5. The anisotropic conductive film according to claim 1, wherein insulating resin in vicinity of the conductive particles in the first connection layer is inclined with respect to a plane direction of the anisotropic conductive film.

6. The anisotropic conductive film according to claim 1, wherein a third connection layer formed mainly of insulating resin is laminated on the first side of the first connection layer.

7. The anisotropic conductive film according to claim 6, wherein the conductive particles dig into the third connection layer.

8. A connection structure comprising a first electronic component and a second electronic component connected by anisotropic conductive connection using the anisotropic conductive film according to claim 7.

9. A method of producing a connection structure, wherein a first electronic component and a second electronic component are connected by anisotropic conductive connection using the anisotropic conductive film according to claim 7, the method comprising:
   temporarily applying the anisotropic conductive film to the second electronic component through the third connection layer;
   mounting the first electronic component on the temporarily applied anisotropic conductive film; and
   performing thermocompression bonding through the first electronic component.

10. A connection structure comprising a first electronic component and a second electronic component connected by anisotropic conductive connection using the anisotropic conductive film according to claim 1.

11. A method of producing a connection structure, wherein a first electronic component and a second electronic component are connected by anisotropic conductive connection using the anisotropic conductive film according to claim 1, the method comprising:
    temporarily applying the anisotropic conductive film to the second electronic component through the first side of the first connection layer;
    mounting the first electronic component on the temporarily applied anisotropic conductive film; and
    performing thermocompression bonding through the first electronic component.

12. An intermediate product film for producing an anisotropic conductive film having a first connection layer and a second connection layer laminated thereon, the first connection layer and the second connection layer being each formed mainly of insulating resin, comprising:
    the first connection layer having a structure in which conductive particles are embedded in the first connection layer and present in a single layer without being in contact with each other, and insulating resin in vicinity of the conductive particles having undulation on a side of the first connection layer opposite the second connection layer, wherein in the first connection layer, a ratio of a thickness t1 of the insulating resin in central regions between adjacent conductive particles to a thickness t2 of the insulating resin in regions in proximity to the conductive particles is in a range of from 0.2 to 0.5.

13. The intermediate product film according to claim 12, wherein the conductive particles are arranged.

* * * * *